United States Patent
Ramakrishnan et al.

(10) Patent No.: US 9,063,426 B2
(45) Date of Patent: *Jun. 23, 2015

(54) METHOD OF MANUFACTURING A FLEXOGRAPHIC PRINTING PLATE WITH SUPPORT STRUCTURES

(71) Applicant: Uni-Pixel Displays, Inc., The Woodlands, TX (US)

(72) Inventors: Ed S. Ramakrishnan, Spring, TX (US); Daniel Van Ostrand, The Woodlands, TX (US)

(73) Assignee: Uni-Pixel Displays, Inc., The Woodlands, TX (US)

( * ) Notice: Subject to any disclaimer, the term of this patent is extended or adjusted under 35 U.S.C. 154(b) by 44 days.

This patent is subject to a terminal disclaimer.

(21) Appl. No.: 14/037,002

(22) Filed: Sep. 25, 2013

(65) Prior Publication Data

US 2015/0086928 A1    Mar. 26, 2015

(51) Int. Cl.
*G03F 7/00*  (2006.01)
*G03F 7/20*  (2006.01)
*B23K 26/36* (2014.01)

(52) U.S. Cl.
CPC ............ *G03F 7/2002* (2013.01); *G03F 7/2032* (2013.01); *B23K 26/365* (2013.01)

(58) Field of Classification Search
CPC .................................. G03F 7/2018; G03F 1/68
USPC .................................................. 430/306, 309
See application file for complete search history.

(56) References Cited

U.S. PATENT DOCUMENTS

| | | | |
|---|---|---|---|
| 6,605,410 B2* | 8/2003 | Yang et al. ................. | 430/273.1 |
| 7,718,352 B2 | 5/2010 | Tachikawa et al. | |
| 8,384,691 B2 | 2/2013 | Frey et al. | |
| 2002/0170451 A1 | 11/2002 | Nakazawa et al. | |
| 2003/0129533 A1* | 7/2003 | Goodin et al. ............. | 430/273.1 |
| 2004/0079246 A1 | 4/2004 | Davis et al. | |
| 2008/0314271 A1 | 12/2008 | Goldfarb | |
| 2010/0028815 A1 | 2/2010 | Zwadlo | |
| 2010/0112311 A1* | 5/2010 | Kobayashi et al. ........ | 428/195.1 |
| 2010/0151387 A1 | 6/2010 | Blanchet et al. | |
| 2010/0282102 A1 | 11/2010 | Mehdizadeh | |

FOREIGN PATENT DOCUMENTS

EP    2313270 A    4/2011

OTHER PUBLICATIONS

International Search Report of the International Searching Authority (Korea) for international application PCT/US2013/078297 dated Apr. 22, 2014.
International Search Report of the International Searching Authority (Korea) for international application PCT/US2013/078325 dated Apr. 14, 2014.
International Search Report of the International Searching Authority (Korea) for international application PCT/US2013/078333 dated Apr. 24, 2014.

(Continued)

*Primary Examiner* — Chanceity Robinson
(74) *Attorney, Agent, or Firm* — Basil M. Angelo

(57) ABSTRACT

A method of manufacturing a flexographic printing plate includes designing a patterned design that includes a plurality of lines and a plurality of support structures and laser-ablating the patterned design into a thermal imaging layer. A support structure of the plurality of support structures is disposed at an offset relative to a line of the plurality of lines.

20 Claims, 20 Drawing Sheets

(56) References Cited

OTHER PUBLICATIONS

International Search Report of the International Searching Authority (Korea) for international application PCT/US2013/078344 dated Jun. 27, 2014.

Written Opinion of the International Searching Authority (Korea) for international application PCT/US2013/078297 dated Apr. 22, 2014.

Written Opinion of the International Searching Authority (Korea) for international application PCT/US2013/078325 dated Apr. 14, 2014.

Written Opinion of the International Searching Authority (Korea) for international application PCT/US2013/078333 dated Apr. 24, 2014.

Written Opinion of the International Searching Authority (Korea) for international application PCT/US2013/078344 dated Jun. 27, 2014.

* cited by examiner

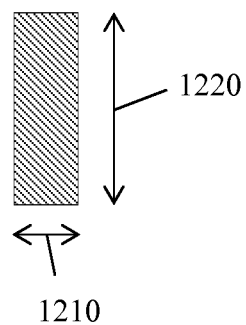
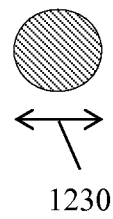
FIG. 12A  FIG. 12B
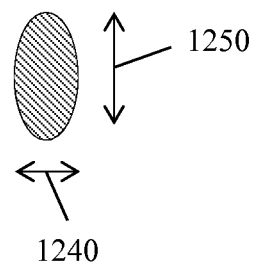
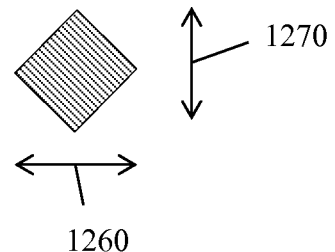
FIG. 12C  FIG. 12D

METHOD OF MANUFACTURING A FLEXOGRAPHIC PRINTING PLATE WITH SUPPORT STRUCTURES

BACKGROUND OF THE INVENTION

An electronic device with a touch screen allows a user to control the device by touch. The user may interact directly with the objects depicted on a display by touch or gestures. Touch screens are commonly found in consumer systems, commercial systems, and industrial systems including, but not limited to, smartphones, tablet computers, laptop computers, desktop computers, kiosks, monitors, televisions, portable gaming devices, and gaming consoles.

A touch screen includes a touch sensor that includes a pattern of conductive lines disposed on a substrate. Flexographic printing is a rotary relief printing process that transfers an image to a substrate. A flexographic printing process may be adapted for use in the manufacture of touch sensors.

BRIEF SUMMARY OF THE INVENTION

According to one aspect of one or more embodiments of the present invention, a method of manufacturing a flexographic printing plate includes designing a patterned design that includes a plurality of lines and a plurality of support structures and laser-ablating the patterned design into a thermal imaging layer. A support structure of the plurality of support structures is disposed at an offset relative to a line of the plurality of lines.

Other aspects of the present invention will be apparent from the following description and claims.

BRIEF DESCRIPTION OF THE DRAWINGS

FIG. 12A shows a substantially rectangular support structure in accordance with one or more embodiments of the present invention.

FIG. 12B shows a substantially circular support structure in accordance with one or more embodiments of the present invention.

FIG. 12C shows a substantially oval support structure in accordance with one or more embodiments of the present invention.

FIG. 12D shows a substantially square support structure in accordance with one or more embodiments of the present invention.

DETAILED DESCRIPTION OF THE INVENTION

Figure 1:
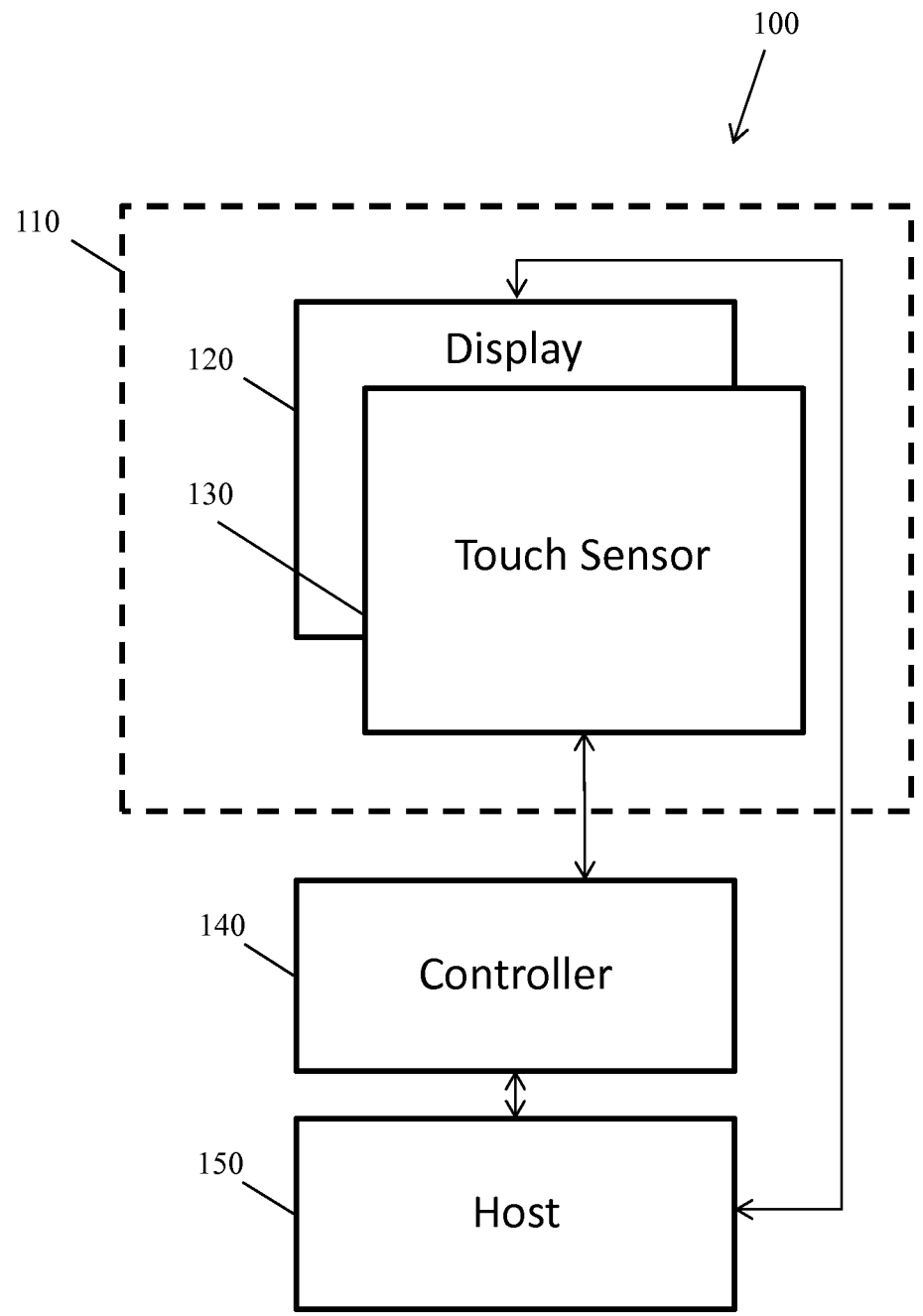
FIG. 1 shows a schematic view of a computing system that includes a touch screen in accordance with one or more embodiments of the present invention.

One or more embodiments of the present invention are described in detail with reference to the accompanying figures. For consistency, like elements in the various figures are denoted by like reference numerals. In the following detailed description of the present invention, specific details are set forth in order to provide a thorough understanding of the present invention. In other instances, well-known features to one of ordinary skill in the art are not described to avoid obscuring the description of the present invention.

A conventional flexographic printing system uses a flexographic printing plate, sometimes referred to as a flexo master, to transfer an image to a substrate. The flexographic printing plate includes one or more embossing patterns, or raised projections, that have distal ends onto which ink or other printable material may be deposited. In operation, the inked flexographic printing plate transfers an ink image of the one or more embossing patterns to the substrate. The ability of a conventional flexographic printing system to print high resolution lines or features is limited by the stability of features formed on the flexographic printing plate.

FIG. 1 shows a schematic view of a computing system that includes a touch screen in accordance with one or more embodiments of the present invention. Computing system 100 may be a consumer computing system, commercial computing system, or industrial computing system including, but not limited to, a smartphone, a tablet computer, a laptop computer, a desktop computer, a monitor, a kiosk, a television, a portable gaming device, and/or a gaming console. One of ordinary skill in the art will recognize that computing system 100 may be any type of system suitable for use with a touch screen.

Computing system 100 includes one or more printed circuit boards (not shown) and/or one or more flex circuits (not shown) on which one or more processors (not shown) and/or system memory (not shown) may be disposed. Each of the one or more processors may be a single-core processor or a multi-core processor. Multi-core processors typically include a plurality of processor cores disposed on the same physical die or a plurality of processor cores disposed on multiple die that are disposed within the same mechanical package.

Computing system 100 may include one or more input/output devices (not shown), one or more local storage devices (not shown) including solid-state memory, a fixed disk drive, a fixed disk drive array, or any other non-transitory computer readable medium, a network interface device (not shown), and/or one or more network storage devices (not shown) including network attached storage devices and cloud-based storage devices.

Touch screen 110 includes a display device 120 and a touch sensor 130 that overlays at least a portion of a viewable area of display device 120. Controller 140 electrically drives touch sensor 130. Touch sensor 130 senses touch and conveys information (capacitance, resistivity, or piezo) corresponding to the sensed touch to controller 140. In typical applications, the manner in which the sensing of touch is tuned, measured, and/or filtered may be configured by controller 140. In addition, controller 140 may recognize one or more gestures based on the sensed touch or touches. Controller 140 provides host 150 with touch or gesture information corresponding to the sensed touch or touches. Host 150 may use this touch or gesture information as user input and respond in an appropriate manner. In this way, the user may interact with computing system 100 by touch or gestures on touch screen 110.

In certain embodiments, host 150 may be the printed circuit board (not shown) and/or flex circuit (not shown) on which the one or more processors (not shown) are disposed. In other embodiments, host 150 may be a subsystem or any other part of computing system 100 configured to interface with display device 120 and controller 140. One of ordinary skill in the art will recognize that host 150, or the functions that it implements, may be distributed among one or more constituent parts of computing system 100 in accordance with one or more embodiments of the present invention.

Figure 2:
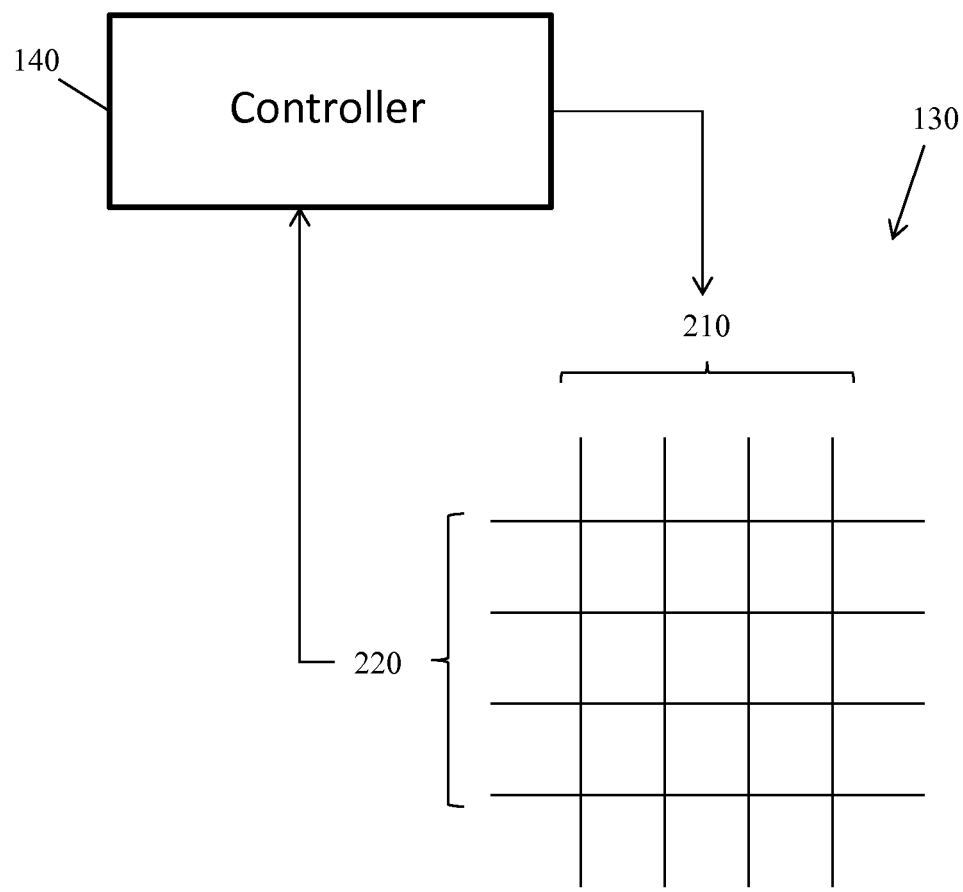
FIG. 2 shows a functional representation of a touch sensor and touch controller in accordance with one or more embodiments of the present invention.

FIG. 2 shows a functional representation of a touch sensor and touch controller in accordance with one or more embodiments of the present invention. In certain embodiments, touch sensor 130 may be viewed as a plurality of column, or transmit, lines 210 and a plurality of row, or receive, lines 220 arranged as a mesh grid. The number of transmit lines 210 and the number of receive lines 220 may not be the same and may vary based on an application or a design. The apparent intersection of transmit lines 210 and receive lines 220 may be viewed as uniquely addressable locations of touch sensor 130. In operation, controller 140 may electrically drive one or more transmit lines 210 and touch sensor 130 may sense touch on one or more receive lines 220 sampled by controller 140. One of ordinary skill in the art will recognize that the role of transmit lines 210 and receive lines 220 may be reversed such that controller 140 electrically drives one or more receive lines 220 and touch sensor 130 may sense touch on one or more transmit lines 210 sampled by controller 140.

In certain embodiments, controller 140 may interface with touch sensor 130 by a scanning process. In such an embodiment, controller 140 may electrically drive a selected transmit line 210 and sample all receive lines 220 that intersect the selected transmit line 210 by measuring, for example, capacitance at each intersection. This process may be continued through all transmit lines 210 such that capacitance is measured at each uniquely addressable location of touch sensor 130 at predetermined intervals. Controller 140 may allow for the adjustment of the scan rate depending on the needs of a particular design or application.

In other embodiments, controller 140 may interface with touch sensor 130 by an interrupt driven process. In such an embodiment, a touch or gesture generates an interrupt to controller 140 that triggers controller 140 to read one or more of its own registers that store sensed touch information sampled from touch sensor 130 at predetermined intervals. One of ordinary skill in the art will recognize that the mechanism by which touch or gestures are sensed by touch sensor 130 and sampled by controller 140 may vary based on an application or a design in accordance with one or more embodiments of the present invention.

Figure 3A:
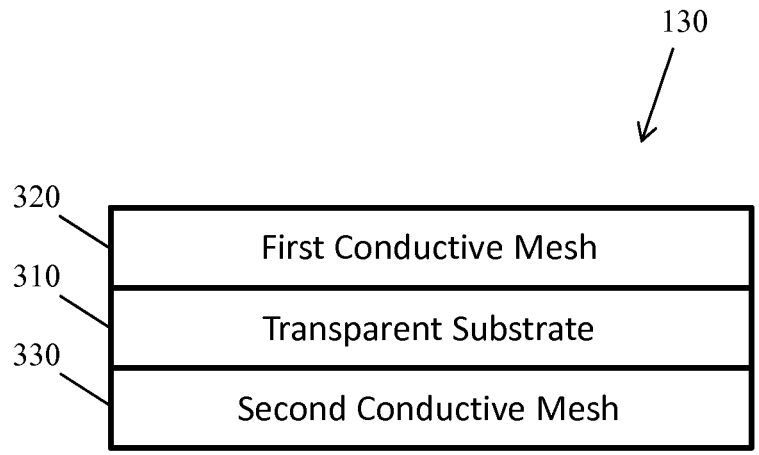
FIG. 3A shows a cross-section of a first conductive mesh disposed on a first side of a transparent substrate and a second conductive mesh disposed on a second side of the transparent substrate in accordance with one or more embodiments of the present invention.
Figure 3B:
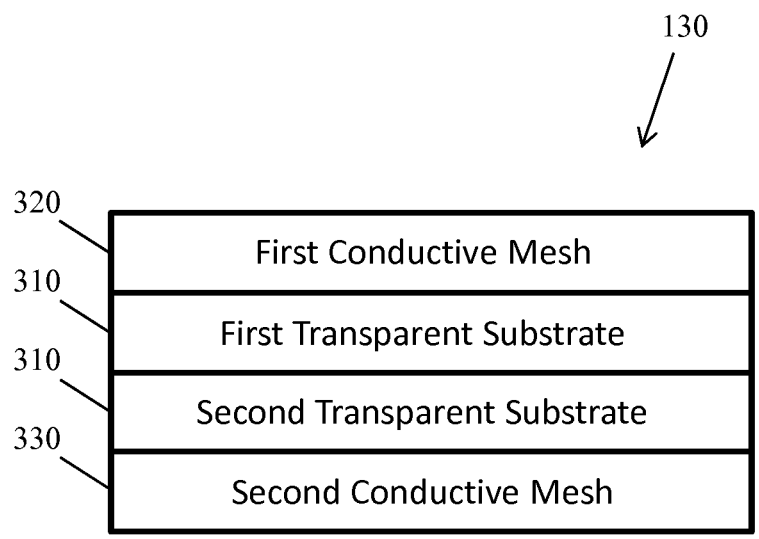
FIG. 3B shows a cross-section of a first conductive mesh disposed on a first transparent substrate that is laminated to a second transparent substrate that has a second conductive mesh disposed on it in accordance with one or more embodiments of the present invention.

In certain embodiments, as depicted in FIG. 3A, touch sensor 130 may include a transparent substrate 310 with a first conductive mesh 320 disposed on a first side of substrate 310 and a second conductive mesh 330 disposed on a second side of substrate 310, forming a projected capacitance touch sensor. In other embodiments, as depicted in FIG. 3B, touch sensor 130 may include a first conductive mesh 320 disposed on a first transparent substrate 310 that is laminated to a second transparent substrate 310 that has a second conductive mesh 330 disposed on it, also forming a projected capacitance touch sensor. One of ordinary skill in the art will recognize that the cross-sectional composition of touch sensor may vary based on an application or a design in accordance with one or more embodiments of the present invention.

With respect to substrate 310, transparent means the transmission of visible light with a transmittance rate of 85% or more. In certain embodiments, substrate 310 may be polyethylene terephthalate ("PET"), polyethylene naphthalate ("PEN"), cellulose acetate ("TAC"), linear low-density polyethylene ("LLDPE"), bi-axially-oriented polypropylene ("BOPP"), polyester, polycarbonate, polypropylene, glass, or combinations thereof. In other embodiments, substrate 310 may be any other transparent material suitable for flexographic printing. One of ordinary skill in the art will recognize that the composition of substrate 310 may vary in accordance with one or more embodiments of the present invention.

In certain embodiments, first conductive mesh 320 may include a mesh of conductors that are partitioned so as to function as a plurality of distinct column, or transmit, lines (210 of FIG. 2). Second conductive mesh 330 may include a mesh of conductors that are partitioned so as to function as a plurality of distinct row, or receive, lines (220 of FIG. 2). In other embodiments, the roles played by the first conductive mesh 320 and the second conductive mesh 330 may be reversed. One of ordinary skill in the art will recognize that the use of first conductive mesh 320 and second conductive mesh 330 may vary based on an application or a design in accordance with one or more embodiments of the present invention.

Figure 4:
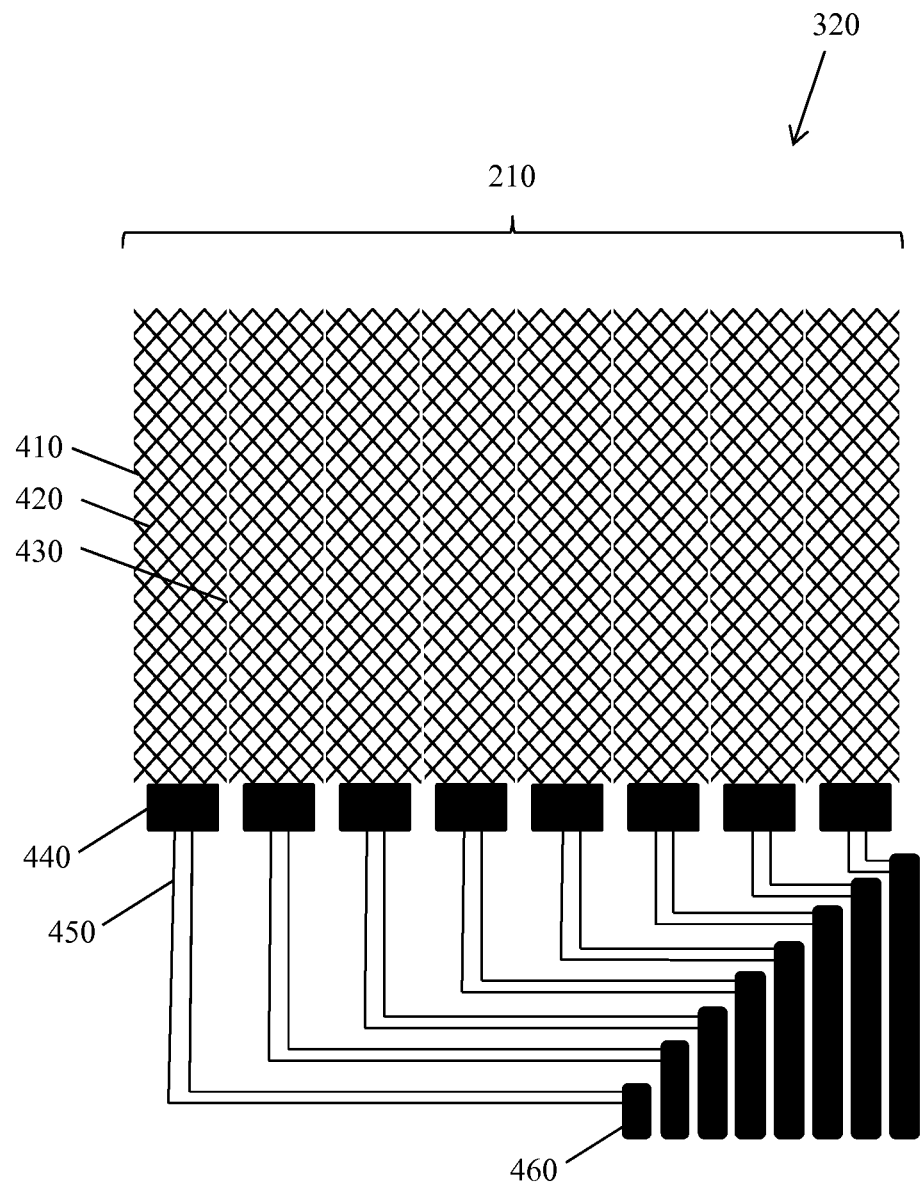
FIG. 4 shows a first conductive mesh disposed on a transparent substrate in accordance with one or more embodiments of the present invention.

FIG. 4 shows a first conductive mesh disposed on a transparent substrate in accordance with one or more embodiments of the present invention. First conductive mesh 320 may include a mesh formed by a plurality of parallel x-axis conductive lines 410 and a plurality of parallel y-axis conductive lines 420 disposed on a first side of a transparent substrate (310 of FIG. 3). One of ordinary skill in the art will recognize that a size of the first conductive mesh may vary based on an application or a design in accordance with one or more embodiments of the present invention.

In certain embodiments, the plurality of parallel x-axis conductors 410 may be substantially parallel to a predetermined x-axis (not shown) and the plurality of parallel y-axis conductors 420 may be substantially parallel to a predetermined y-axis (not shown). In other embodiments, the plurality of parallel x-axis conductors 410 may be angled relative to a predetermined x-axis and the plurality of parallel y-axis conductors 420 may be angled relative to a predetermined y-axis. One of ordinary skill in the art will recognize that the orientation of the plurality of parallel x-axis conductive lines 410 and the orientation of the plurality of parallel y-axis conductive lines 420 may vary based on an application or a design in accordance with one or more embodiments of the present invention.

In certain embodiments, the plurality of parallel x-axis conductive lines 410 may be perpendicular to the plurality of parallel y-axis conductive lines 420. In other embodiments, the plurality of parallel x-axis conductive lines 410 may be angled relative to the plurality of parallel y-axis conductive lines 420. One of ordinary skill in the art will recognize that the relative angle between the plurality of parallel x-axis conductive lines 410 and the plurality of parallel y-axis conductive lines 420 may vary based on an application or a design in accordance with one or more embodiments of the present invention.

In certain embodiments, a plurality of breaks 430 may partition first conductive mesh 320 into a plurality of column, or transmit, lines 210, each electrically partitioned from the others. Each transmit line 210 may route to a channel pad 440. Each channel pad 440 may route to an interface connector 460 by way of one or more interconnect conductive lines 450. Interface connectors 460 may provide a connection interface between the touch sensor (130 of FIG. 1) and the controller (140 of FIG. 1).

Figure 5:
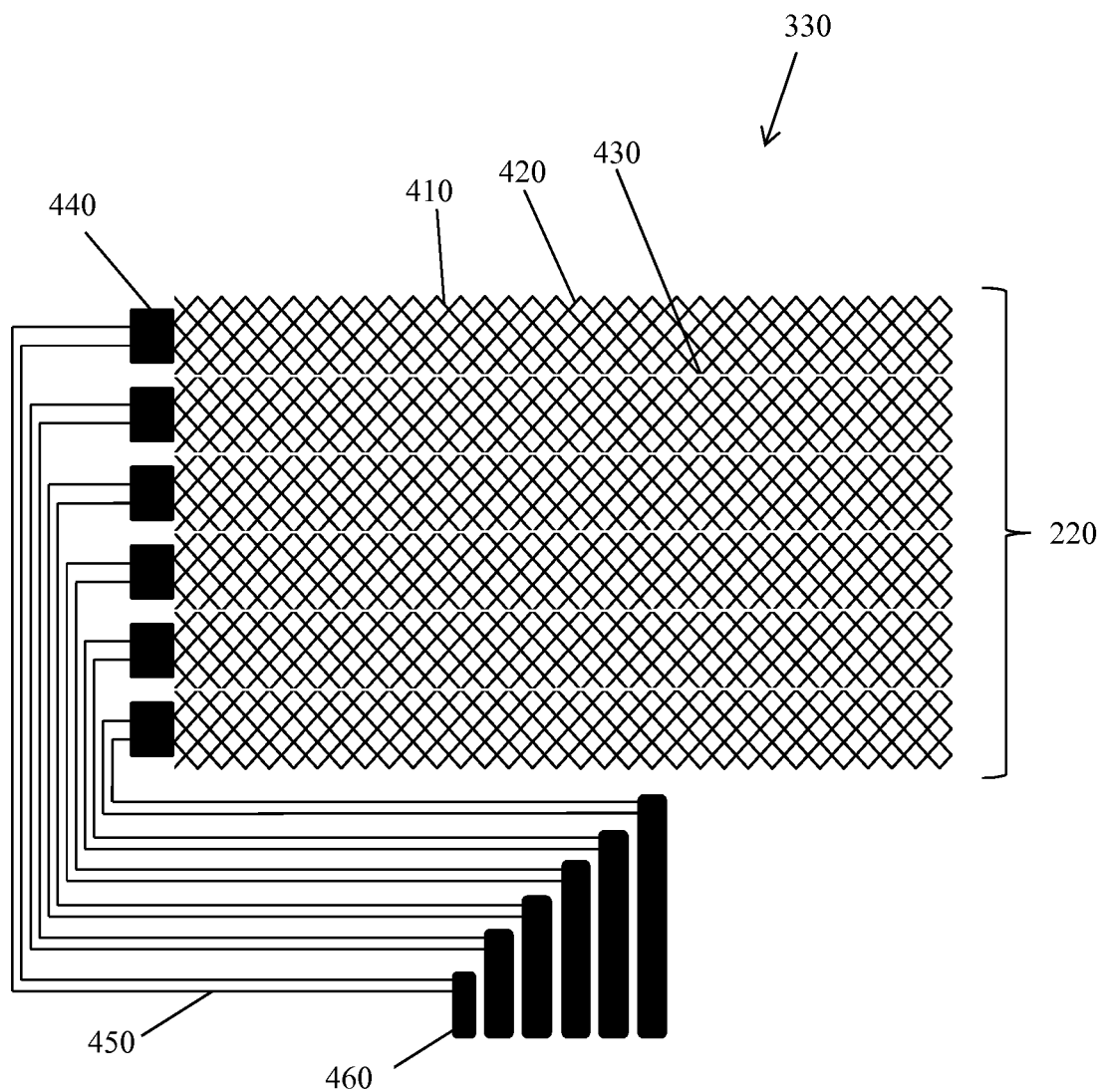
FIG. 5 shows a second conductive mesh disposed on a transparent substrate in accordance with one or more embodiments of the present invention.

FIG. 5 shows a second conductive mesh disposed on a transparent substrate in accordance with one or more embodiments of the present invention. Second conductive mesh 330 may include a mesh formed by a plurality of parallel x-axis conductive lines 410 and a plurality of parallel y-axis conductive lines 420 disposed on a second side of a transparent substrate (310 of FIG. 3). One of ordinary skill in the art will recognize that a size of the second conductive mesh may vary based on an application or a design in accordance with one or more embodiments of the present invention. Typically, the second conductive mesh is substantially similar in size to the first conductive mesh.

In certain embodiments, the plurality of parallel x-axis conductors 410 may be substantially parallel to a predetermined x-axis (not shown) and the plurality of parallel y-axis conductors 420 may be substantially parallel to a predetermined y-axis (not shown). In other embodiments, the plurality of parallel x-axis conductors 410 may be angled relative to a predetermined x-axis and the plurality of parallel y-axis conductors 420 may be angled relative to a predetermined y-axis. One of ordinary skill in the art will recognize that the orientation of the plurality of parallel x-axis conductive lines 410 and the orientation of the plurality of parallel y-axis conductive lines 420 may vary based on an application or a design in accordance with one or more embodiments of the present invention.

In certain embodiments, the plurality of parallel x-axis conductive lines 410 may be perpendicular to the plurality of parallel y-axis conductive lines 420. In other embodiments, the plurality of parallel x-axis conductive lines 410 may be angled relative to the plurality of parallel y-axis conductive lines 420. One of ordinary skill in the art will recognize that the relative angle between the plurality of parallel x-axis conductive lines 410 and the plurality of parallel y-axis conductive lines 420 may vary based on an application or a design in accordance with one or more embodiments of the present invention.

In certain embodiments, a plurality of breaks 430 may partition second conductive mesh 330 into a plurality of row, or receive, lines 220, each electrically partitioned from the others. Each receive line 220 may route to a channel pad 440. Each channel pad 440 may route to an interface connector 460 by way of one or more interconnect conductive lines 450. Interface connectors 460 may provide a connection interface between the touch sensor (130 of FIG. 1) and the controller (140 of FIG. 1).

Figure 6:
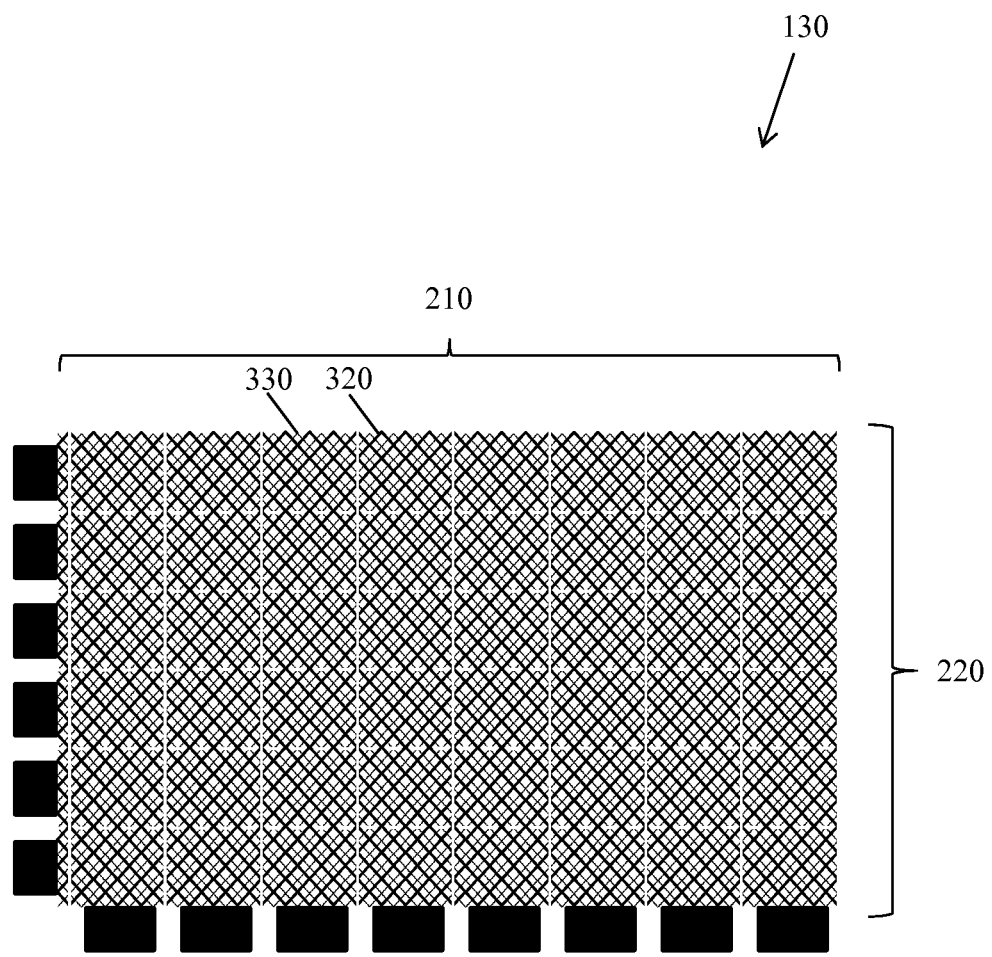
FIG. 6 shows a touch sensor in accordance with one or more embodiments of the present invention.

FIG. 6 shows a touch sensor in accordance with one or more embodiments of the present invention. A touch sensor 130 may be formed by disposing a first conductive mesh 320 on a first side of a transparent substrate (310 of FIG. 3) and disposing a second conductive mesh 330 on a second side of the transparent substrate (310 of FIG. 3). The first conductive mesh and the second conductive mesh may be offset relative to one another. One of ordinary skill in the art will recognize that the offset between the first conductive mesh and the second conductive mesh may vary based on an application or a design in accordance with one or more embodiments of the present invention.

In certain embodiments, the first conductive mesh 320 may include a plurality of parallel x-axis conductive lines (410 of FIG. 4) and a plurality of parallel y-axis conductive lines (420 of FIG. 4) that form a mesh that is partitioned by a plurality of breaks (430 of FIG. 4) into electrically partitioned column, or transmit, lines 210. The second conductive mesh 330 may include a plurality of parallel x-axis conductive lines (410 of FIG. 5) and a plurality of parallel y-axis conductive lines (420 of FIG. 5) that form a mesh that is partitioned by a plurality of breaks (430 of FIG. 5) into electrically partitioned row, or receive, lines 220. In operation, a controller (140 of FIG. 2) may electrically drive one or more transmit lines 210 and touch sensor 130 senses touch on one or more receive lines 220 sampled by the controller (140 of FIG. 2). In other embodiments, the role of the first conductive mesh and the second conductive mesh may be reversed.

In certain embodiments, one or more of the plurality of parallel x-axis conductive lines (410 of FIG. 4 and FIG. 5), one or more of the plurality of parallel y-axis conductive lines (420 of FIG. 4 and FIG. 5), one or more of the plurality of breaks (430 of FIG. 4 and FIG. 5), one or more of the plurality of channel pads (440 of FIG. 4 and FIG. 5), one or more of the plurality of interconnect conductive lines (450 of FIG. 4 and FIG. 5), and/or one or more of the plurality of interface connectors (460 of FIG. 4 and FIG. 5) of the first conductive mesh 320 or second conductive mesh 330 may have different line widths and/or different orientations. In addition, the number of parallel x-axis conductive lines (410 of FIG. 4 and FIG. 5), the number of parallel y-axis conductive lines (420 of FIG. 4 and FIG. 5), and the line-to-line spacing between them may vary based on an application or a design. One of ordinary skill in the art will recognize that the size, configuration, and design of each conductive mesh may vary in accordance with one or more embodiments of the present invention.

In certain embodiments, one or more of the plurality of parallel x-axis conductive lines (410 of FIG. 4 and FIG. 5) and one or more of the plurality of parallel y-axis conductive lines (420 of FIG. 4 and FIG. 5) may have a line width less than approximately 5 micrometers. In other embodiments, one or more of the plurality of parallel x-axis conductive lines (410 of FIG. 4 and FIG. 5) and one or more of the plurality of parallel y-axis conductive lines (420 of FIG. 4 and FIG. 5) may have a line width in a range between approximately 5 micrometers and approximately 10 micrometers. In still other embodiments, one or more of the plurality of parallel x-axis conductive lines (410 of FIG. 4 and FIG. 5) and one or more of the plurality of parallel y-axis conductive lines (420 of FIG. 4 and FIG. 5) may have a line width in a range between approximately 10 micrometers and approximately 50 micrometers. In still other embodiments, one or more of the plurality of parallel x-axis conductive lines (410 of FIG. 4 and FIG. 5) and one or more of the plurality of parallel y-axis conductive lines (420 of FIG. 4 and FIG. 5) may have a line width greater than approximately 50 micrometers. One of ordinary skill in the art will recognize that the shape and width of one or more of the plurality of parallel x-axis conductive lines (410 of FIG. 4 and FIG. 5) and one or more of the plurality of parallel y-axis conductive lines (420 of FIG. 4 and FIG. 5) may vary in accordance with one or more embodiments of the present invention.

In certain embodiments, one or more of the plurality of channel pads (440 of FIG. 4 and FIG. 5), one or more of the plurality of interconnect conductive lines (450 of FIG. 4 and FIG. 5), and/or one or more of the plurality of interface connectors (460 of FIG. 4 and FIG. 5) may have a different width or orientation. In addition, the number of channel pads (440 of FIG. 4 and FIG. 5), interconnect conductive lines (450 of FIG. 4 and FIG. 5), and/or interface connectors (460 of FIG. 4 and FIG. 5) and the line-to-line spacing between them may vary based on an application or a design. One of ordinary skill in the art will recognize that the size, configuration, and design of each channel pad (440 of FIG. 4 and FIG. 5), interconnect conductive line (450 of FIG. 4 and FIG. 5), and/or interface connector (460 of FIG. 4 and FIG. 5) may vary in accordance with one or more embodiments of the present invention.

In typical applications, each of the one or more channel pads (440 of FIG. 4 and FIG. 5), interconnect conductive lines (450 of FIG. 4 and FIG. 5), and/or interface connectors (460 of FIG. 4 and FIG. 5) have a width substantially larger than each of the plurality of parallel x-axis conductive lines (410 of FIG. 4 and FIG. 5) or each of the plurality of parallel y-axis conductive lines (420 of FIG. 4 and FIG. 5). One of ordinary skill in the art will recognize that the size, configuration, and design as well as the number, shape, and width of channel pads (440 of FIG. 4 and FIG. 5), interconnect conductive lines (450 of FIG. 4 and FIG. 5), and/or interface connectors (460 of FIG. 4 and FIG. 5) may vary based on an application or a design in accordance with one or more embodiments of the present invention.

Figure 7:
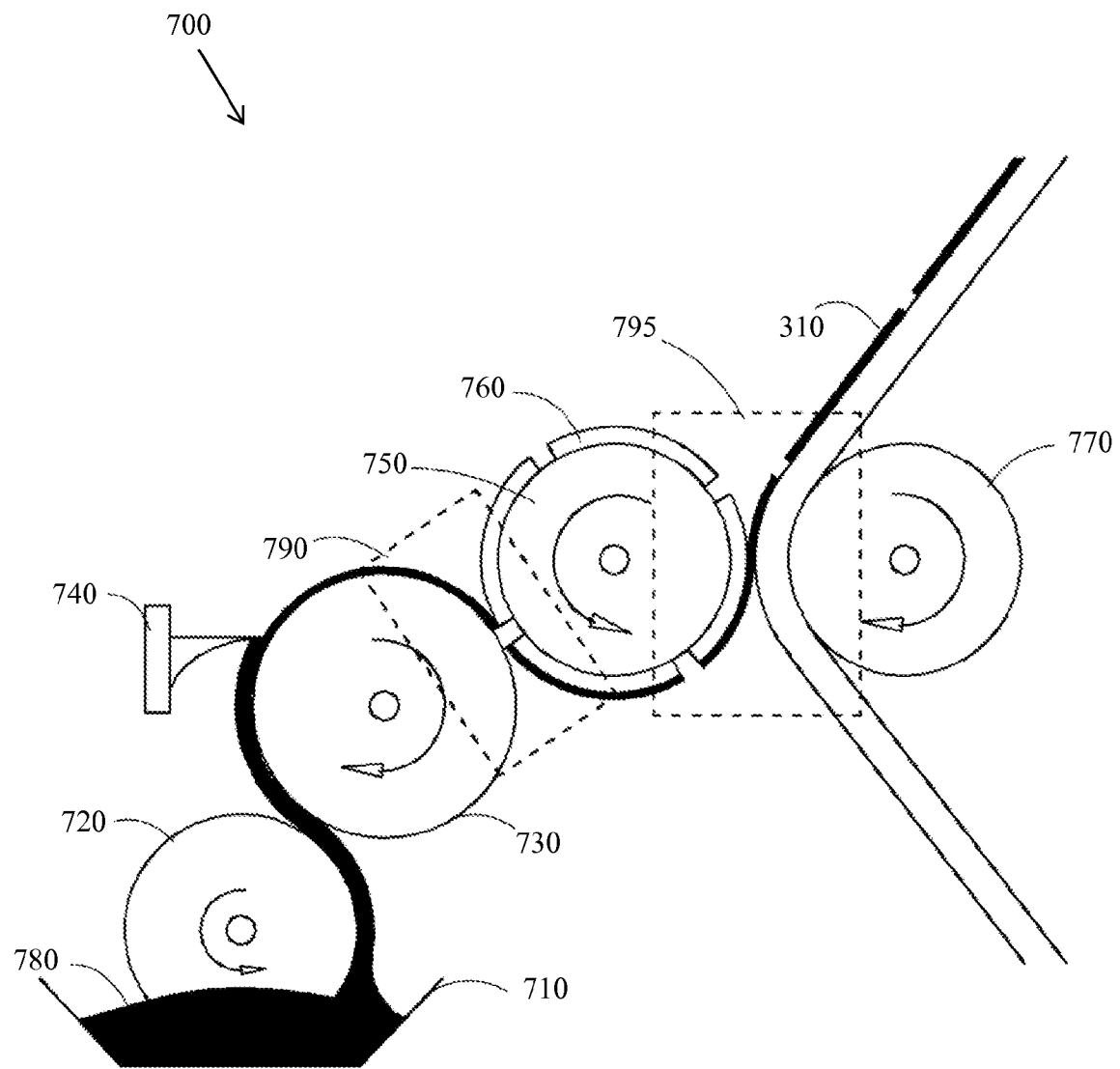
FIG. 7 shows a flexographic printing system in accordance with one or more embodiments of the present invention.

FIG. 7 shows a flexographic printing system in accordance with one or more embodiments of the present invention. Flexographic printing system 700 may include an ink pan 710, an ink roll 720 (also referred to as a fountain roll), an anilox roll 730 (also referred to as a meter roll), a doctor blade 740, a printing plate cylinder 750, a flexographic printing plate 760 with support structures, and an impression cylinder 770.

In operation, ink roll 720 transfers ink 780 from ink pan 710 to anilox roll 730. In certain embodiments, ink 780 may be a catalytic ink or catalytic alloy ink that serves as a plating seed suitable for metallization by electroless plating. In other embodiments, ink 780 may be a conductive ink that does not require metallization. One of ordinary skill in the art will recognize that the composition of ink 780 may vary based on an application. Anilox roll 730 is typically constructed of a steel or aluminum core that may be coated by an industrial ceramic whose surface contains a plurality of very fine dimples, also referred to as cells (not shown). Doctor blade 740 removes excess ink 780 from anilox roll 730. In transfer area 790, anilox roll 730 meters the amount of ink 780 transferred to flexographic printing plate 760 to a uniform thickness. Printing plate cylinder 750 may be made of metal and the surface may be plated with chromium, or the like, to provide increased abrasion resistance. High-resolution flexographic printing plate 760 may be mounted to printing plate cylinder 750 by an adhesive (not shown).

One or more substrates 310 move between printing plate cylinder 750 and impression cylinder 770. In one or more embodiments of the present invention, substrate 310 may be transparent. In certain embodiments, substrate 310 may be PET, PEN, TAC, LLDPE, BOPP, polyester, polycarbonate, polypropylene, glass, or combinations thereof. In other embodiments, substrate 310 may be any other transparent material suitable for flexographic printing. One of ordinary skill in the art will recognize that the composition of substrate 310 may vary in accordance with one or more embodiments of the present invention. Impression cylinder 770 applies pressure to printing plate cylinder 750, transferring an image from the embossing patterns of flexographic printing plate 760 onto substrate 310 at transfer area 795. The rotational speed of printing plate cylinder 750 is synchronized to match the speed at which substrate 310 moves through flexographic printing system 700. The speed may vary between 20 feet per minute to 750 feet per minute.

In one or more embodiments of the present invention, flexographic printing system 700 may be used to print a precursor or catalyst ink (not shown) image of one or more conductive meshes (320 or 330 of FIG. 3) on one or more sides of substrate 310. In certain embodiments, subsequent to flexographic printing, the precursor or catalyst ink (not shown) may be metallized by an electroless plating process, forming one or more conductive meshes (320 or 330 of FIG. 3) on substrate 310. In other embodiments, the ink may be a direct-printed (dense metal-filled) conductive ink 780 that may not require electroless plating. The one or more conductive meshes (320 or 330 of FIG. 3) on substrate 310 may be used to form a touch sensor (130 of FIG. 6).

Figure 8A:
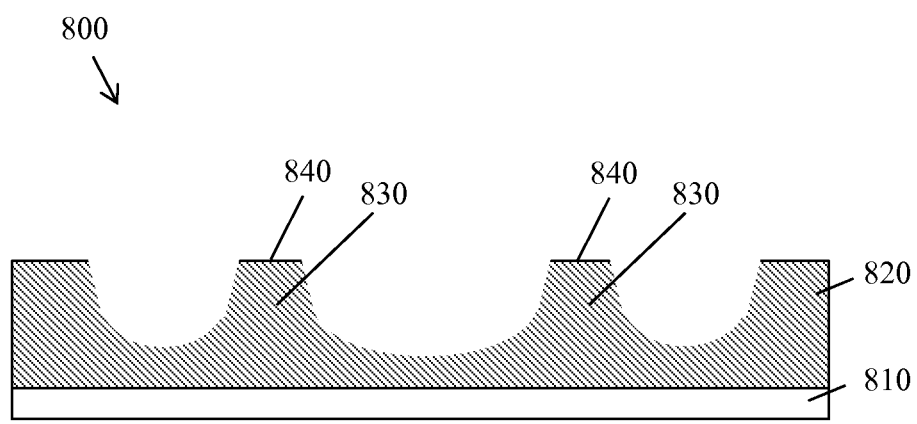
FIG. 8A shows a cross-section of a portion of a flexographic printing plate with lines or features having substantially flat contact surfaces in accordance with one or more embodiments of the present invention.
Figure 8B:
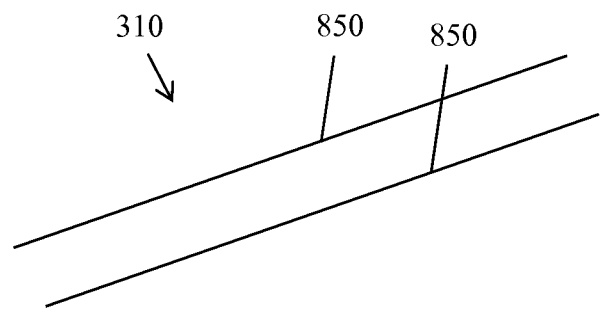
FIG. 8B shows a printed ink image of a plurality of parallel lines on a substrate in accordance with one or more embodiments of the present invention.

In FIG. 8A, a flexographic printing plate 800 may include a PET base layer 810 covered by a photo-sensitive polymer layer 820. A plurality of lines or features 830 may be formed in photo-sensitive polymer layer 820. The plurality of lines or features 830 have distal ends, or contact surfaces, 840 onto which ink or other material (780 of FIG. 7) may be deposited during flexographic printing operations. Because the contact surfaces 840 are substantially flat, flexographic printing plate 800 may transfer an ink (780 of FIG. 7) image corresponding to the plurality of lines or features 830 to a substrate (310 of FIG. 7). Continuing in FIG. 8B, flexographic printing plate 800 may be used as part of a flexographic printing system (700 of FIG. 7) configured to print an ink (780 of FIG. 7) image 850 of the plurality of parallel lines 830 on substrate 310 as part of a precursor mesh (not shown) that may be electroless plated to form a conductive mesh (320 or 330 of FIG. 3) or a direct-printed conductive ink (780 of FIG. 7) image 850 of the plurality of parallel lines 830 on substrate 310 as part of a conductive mesh (320 or 330 of FIG. 3).

Figure 9A:
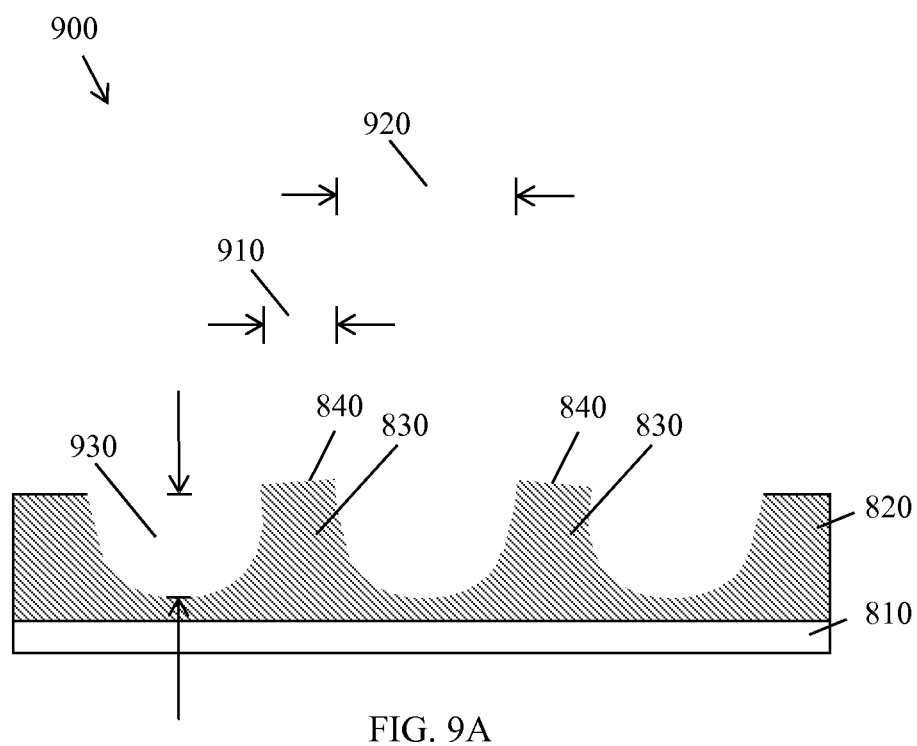
FIG. 9A shows a cross-section of a portion of a flexographic printing plate with lines or features having uneven contact surfaces in accordance with one or more embodiments of the present invention.
Figure 9B:
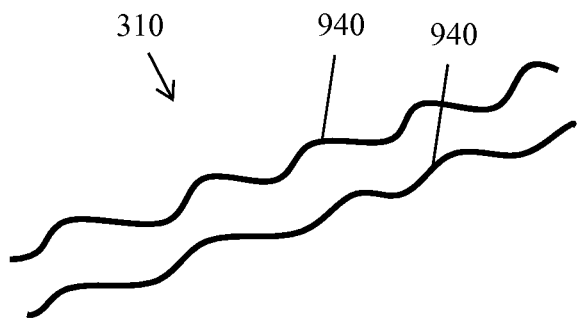
FIG. 9B shows a printed ink image of a plurality of parallel lines on a substrate that exhibit waviness in accordance with one or more embodiments of the present invention.

In FIG. 9A, a flexographic printing plate 900 may include a PET base layer 810 covered by a photo-sensitive polymer layer 820. A plurality of lines or features 830 may be formed in photo-sensitive polymer layer 820. The plurality of lines or features 830 have distal ends, or contact surfaces, 840 onto which ink or other material (780 of FIG. 7) may be deposited during flexographic printing operations. The contact surfaces 840 may be uneven for a number of reasons including, but not limited to, the use of a flexographic printing plate 900 that is uneven or otherwise not smooth prior to and/or after manufacture of flexographic printing plate 900 itself. Because the contact surfaces 840 are uneven, flexographic printing plate 900 may transfer a wavy ink (780 of FIG. 7) image corresponding to the plurality of lines or features 830 to a substrate (310 of FIG. 7). Line widths of 10 micrometers or less tend to exhibit waviness and line widths less than 5 micrometers are very sensitive and prone to waviness. Continuing in FIG. 9B, flexographic printing plate 900 may be used as part of a flexographic printing system (700 of FIG. 7) configured to print an ink (780 of FIG. 7) image 940 of the plurality of parallel lines 830 on substrate 310 as part of a precursor mesh (not shown) that is electroless plated to form a conductive mesh (320 or 330 of FIG. 3) or a direct-printed conductive ink (780 of FIG. 7) image 940 of the plurality of parallel lines 830 on substrate 310 as part of a conductive mesh (320 or 330 of FIG. 3).

Undesired waviness of printed lines or features 940 on substrate 310 may contribute to functional performance issues of a conductive mesh (320 or 330 of FIG. 3). Undesired waviness of printed lines or features 940 on substrate 310 may lead to electrical breaks that unintentionally break electrical continuity and functionality. For example, a printed line or feature 940 on substrate 310 that exhibits waviness may not make an intended connection to another printed line or feature (not shown). The wavy printed line or feature 940 on substrate 310 may be metallized by an electroless plating process that essentially plates the wavy printed line or feature 940 as it exists on the substrate 310, resulting in a corresponding wavy conductive line or feature (not independently illustrated). Consequently, an unintended break in the wavy printed line or feature 940 on substrate 310 typically results in an unintended break in the corresponding wavy conductive line or feature (not independently illustrated). The unintended break causes a loss of electrical continuity and may render the wavy conductive line or feature (not independently illustrated), and perhaps even the larger conductive mesh (320 or 330 of FIG. 3) or touch sensor (130 of FIG. 1), inoperable.

Similarly, undesired waviness of printed lines or features 940 on substrate 310 may lead to electrical shorts that unintentionally short conductive lines or features (not independently illustrated) together. For example, a printed line or feature 940 on substrate 310 that exhibits waviness may make an unintended connection to another printed line or feature (not shown). The wavy printed line or feature 940 on substrate 310 may be metallized by an electroless plating process that essentially plates the wavy printed line or feature 940 as it exists on the substrate 310, resulting in a corresponding wavy conductive line or feature (not independently illustrated). Consequently, an unintended short in the wavy printed line or feature 940 on substrate 310 typically results in an unintended short in the corresponding wavy conductive line or feature. The unintended short may render the wavy conductive line or feature (not independently illustrated), and perhaps even the larger conductive mesh (320 or 330 of FIG. 3) or touch sensor (130 of FIG. 1), inoperable.

Undesired waviness of printed lines or features 940 on substrate 310 may also contribute to aesthetic performance issues of a conductive mesh (320 or 330 of FIG. 3). The conductive mesh (320 or 330 of FIG. 3) may use high-resolution lines or features (not independently illustrated) to reduce or eliminate the visual appearance of the conductive mesh (320 or 330 of FIG. 3) to an end user of a touch sensor (130 of FIG. 1) under normal operating conditions, such as a user viewing the touch screen (110 of FIG. 1) without magnification at a reasonable distance. However, the waviness of printed lines or features 940 on substrate 310 may cause conductive lines or features to be more visually apparent than they would otherwise be. In addition, the waviness of printed lines or features 940 may cause Moiré interference that creates additional patterns that are more visually apparent than the conductive mesh (320 or 330 of FIG. 3) alone would otherwise be. The waviness of printed lines or features 940 may also cause unintended variations in line-to-line spacing. If the line-to-line spacing deviates from design specifications, optical performance may be compromised by the loss of optical transmission when used as part of a touch screen (110 of FIG. 1).

In addition to uneven contact surfaces 840, other factors may contribute to waviness in printed lines or features 940 on substrate 310. For example, breaks (430 of FIG. 4 and FIG. 5) that partition the conductive meshes (320 and 330 of FIG. 3) into transmit lines (210 of FIG. 4) and receive lines (220 of FIG. 5) may contribute to waviness in printed lines or features 940 on substrate 310 near the location of the breaks (430 of FIG. 4 and FIG. 5). When printing lines or features 940 that includes a plurality of breaks (430 of FIG. 4 and FIG. 5), the high-resolution printed lines or features 940 tend to skew near the location of the break (430 of FIG. 4 and FIG. 5) resulting in wavy printed lines or features 940 on substrate 310. However, breaks (430 of FIG. 4 and FIG. 5) are necessary to form the transmit lines (210 of FIG. 4) and receive lines (220 of FIG. 5).

During flexographic printing operations, the pressure exerted by an impression cylinder (770 of FIG. 7) may be uneven and may bend one or more lines or features 830 formed in flexographic printing plate 900. Even under normal operating conditions, the nominal pressure exerted by the impression cylinder (770 of FIG. 7) may bend one or more lines or features 830 formed in flexographic printing plate 900. The bending of the lines or features 830 of flexographic printing plate 900 may contribute to waviness of the printed lines or features 940 on substrate 310. The susceptibility of flexographic printing plate 900 to waviness may be impacted by the width 910 of the lines or features 830, the line-to-line spacing 920 of the lines or features 830, the relief depth 930 of the lines or features 830, and/or the shape of the relief depth 930 formed between the lines or features 830.

The waviness of printed lines or features 940 on substrate 310 may scale with the reduction in the line or feature 830 size. As the width 910 of lines or features 830 decreases, the waviness of the printed lines or features 940 on substrate 310 may increase. This is particularly noticeable in lines or features 830 having a width 910 less than 10 micrometers and is readily apparent in lines or features 830 having a width 910 less than 5 micrometers. Because the acceptable aesthetic performance of a conductive mesh (320 or 330 of FIG. 3) requires lines or features 830 having a small width 910 so that the conductive mesh (320 or 330 of FIG. 3) is not visually apparent at normal operating conditions, the problem of waviness cannot be solved by increasing the line or feature 830 width 910.

The waviness of printed lines or features 940 on substrate 310 may also scale with the line-to-line spacing 920 between lines or features 830 on flexographic printing plate 900. As the line-to-line spacing 920 increases, the waviness of the printed lines or features 940 on substrate 310 may increase. The line-to-line spacing 920 between lines or features 830 is typically governed by the size of the conductive mesh (320 or 330 of FIG. 3), the resolution of touch sensing desired, and/or the acceptable aesthetic performance (lack of visual appearance at normal operating conditions) as part of a touch sensor (130 of FIG. 1) design or application. In certain embodiments, the line-to-line spacing 920 between lines or features 830 having a width 910 less than 10 micrometers may be in a range between approximately 200 micrometers and approximately 600 micrometers. Because the line-to-line spacing 920 is substantially larger than the width 910 (not drawn to scale in FIG. 9) of lines or features 830, the problem of waviness cannot be solved by reducing the line-to-line spacing 920 between lines or features 830.

The waviness of printed lines or features 940 on substrate (310 of FIG. 7) may also scale with the relief depth 930 used to form the lines or features 830 on flexographic printing plate 900. As the relief depth 930 increases, the waviness of the printed lines or features 940 on substrate 310 may increase. While shallower relief depths 930 help reduce the waviness of the printed lines or features 940 on substrate 310, a relief depth 930 that is too shallow leads to electrical breaks, electrical shorts, and smearing of printed lines or features 940 on substrate 310. As such, the problem of waviness may not be solved by reducing the relief depth 930 of flexographic printing plate 900. In addition, the shape of the relief depth 930 formed between lines or features 830 on flexographic printing plate 900 may contribute to the waviness of printed lines or features 940 on substrate 310. During the manufacture of flexographic printing plate 900, the penetration of ultraviolet ("UV") radiation into photo-sensitive polymer layer 820 may not be evenly distributed or easily controllable. As a consequence, the shape of relief depth 930 may be substantially U-shaped and not tightly controlled. Because of the U-shape of relief depth 930, lines or features 830 may be more susceptible to bending leading to waviness in printed lines or features 940 on substrate 310. In addition, as the line-to-line spacing increases, the area exposed to UV increases and there may be localized areas of base non-uniformity, distortion, or bending that contributes to waviness in lines or features 830.

Figure 10:
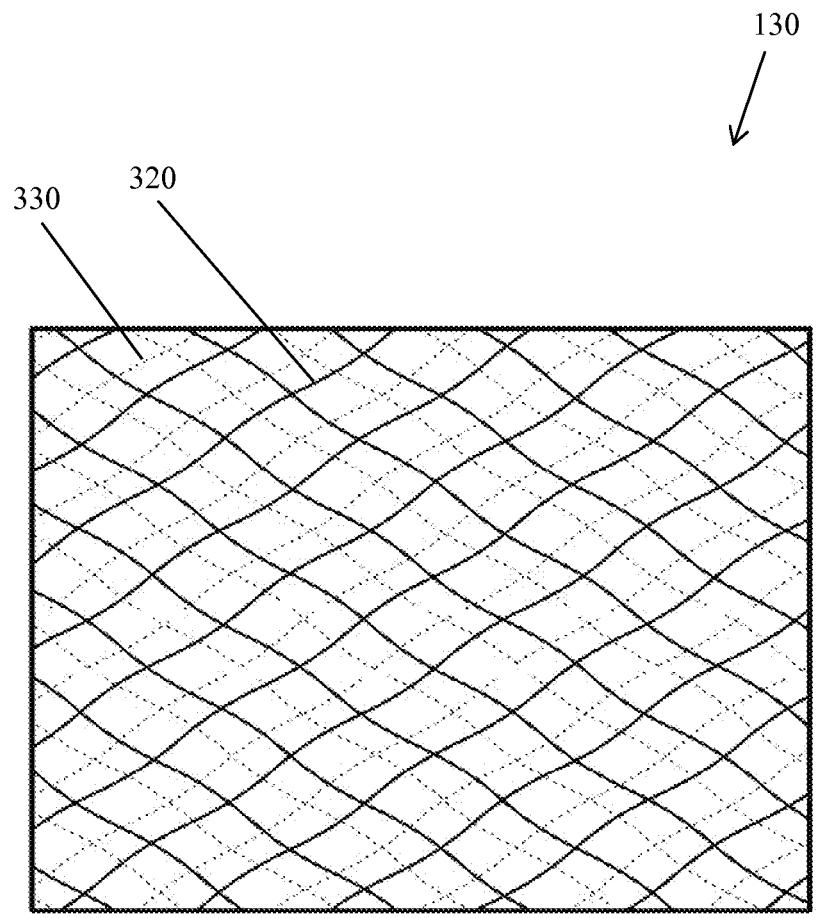
FIG. 10 shows a portion of a touch sensor exhibiting wavy lines in accordance with one or more embodiments of the present invention.

FIG. 10 shows a portion of a touch sensor exhibiting wavy lines in accordance with one or more embodiments of the present invention. In the figure, a blown-up portion of touch sensor 130 exhibits waviness in the conductive lines of conductive mesh 320 and conductive mesh 330 disposed on substrate (310 of FIG. 3). In addition to performance issues that may negatively affect functionality of touch sensor 130, the waviness may contribute to aesthetic performance issues as the wavy conductive lines or features of conductive mesh 320 and/or conductive mesh 330 are more visually apparent and may result in Moiré interference that is visually apparent to an end user under normal operating conditions.

Figure 11:
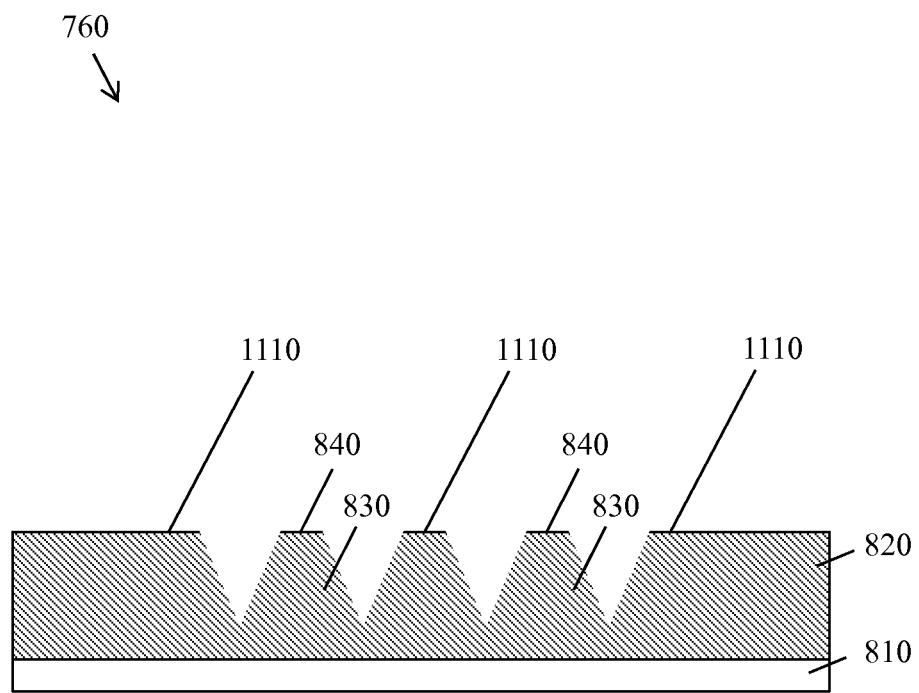
FIG. 11 shows a cross-section of a portion of a flexographic printing plate with support structures in accordance with one or more embodiments of the present invention.

FIG. 11 shows a cross-section of a portion of a flexographic printing plate with support structures in accordance with one or more embodiments of the present invention. Flexographic printing plate 760 may be used as part of a flexographic printing system (700 of FIG. 7) configured to print high-resolution precursor meshes or direct-printed conductive ink meshes that form conductive meshes (320 and 330 of FIG. 3) on a substrate (310 of FIG. 7) as part of a process to manufacture a touch sensor (130 of FIG. 1). Flexographic printing plate 760 may include a PET base layer 810 covered by a photo-sensitive polymer layer 820. A plurality of lines or features 830 may be formed in the photo-sensitive polymer layer 820. The plurality of lines or features 830 may have distal ends, or contact surfaces, 840 onto which ink or other material (780 of FIG. 7) may be deposited during flexographic printing operations.

In one or more embodiments of the present invention, a plurality of support structures 1110 may also be formed in the photo-sensitive polymer layer 820 of flexographic printing plate 760. The support structures 1110 may strengthen one or more lines or features 830 and/or reduce or eliminate the bending of the one or more lines or features 830 during flexographic printing operations. In addition, the support structures 1110 may reduce or eliminate waviness in one or more of the printed lines or features (not shown) on substrate (310 of FIG. 7) and ultimately the conductive meshes (320 and 330 of FIG. 3) they may form.

In one or more embodiments of the present invention, the number, the shape, the height, and/or the location of one or more support structures 1110 may vary based on an application or design. While the inclusion of a plurality of support structures 1110 may reduce or eliminate waviness (and consequently the associated functional performance issues), the plurality of support structures 1110 may contribute to aesthetic performance issues. For example, the plurality of support structures 1110 may contribute to Moiré interference or otherwise render the conductive meshes (320 or 330 of FIG. 3) more visually apparent to an end user under normal operating conditions. Thus, in one or more embodiments of the present invention, the number, the shape, the height, and/or the location of one or more support structures 1110 may be optimized for a given application or design to ensure that the addition of the support structures 1110 to a conductive mesh (320 or 330 of FIG. 3) still meets acceptable aesthetic performance, i.e., lack of visual appearance of the conductive meshes (320 or 330 of FIG. 3) to an end user under normal operating conditions.

In one or more embodiments of the present invention, the plurality of support structures 1110 may be isolated from, or otherwise not connected to, the lines or features 830 of flexographic printing plate 760. The corresponding plurality of printed support structures (not shown) on substrate (310 of FIG. 7) are also isolated from, or otherwise not connected to, the printed lines or features (not shown) on substrate (310 of FIG. 7). In this way, the plurality of support structures 1110 may provide a support function, but do not contribute to, or otherwise play a role in, the connectivity of the lines or features 830 or the conductive meshes (320 or 330 of FIG. 3) that they may form.

FIGS. 12A through 12D show support structures having different shapes in accordance with one or more embodiments of the present invention. In FIG. 12A, a substantially rectangular support structure (1110 of FIG. 11) is depicted. The rectangular support structure (1110 of FIG. 11) may have a width 1210 and a length 1220 that may vary based on an application or a design. In certain embodiments, the width 1210 of the rectangular support structure may be the same as the width (910 of FIG. 9) of one or more lines or features (830 of FIG. 11). In other embodiments, the width 1210 of the rectangular support structure may be smaller than the width (910 of FIG. 9) of one or more lines or features (830 of FIG. 11). In still other embodiments, the width 1210 of the rectangular support structure may be larger than the width (910 of FIG. 9) of one or more lines or features (830 of FIG. 11). One of ordinary skill in the art will recognize that the width 1210 of the rectangular support structure (1110 of FIG. 11) may vary based on an application or a design in accordance with one or more embodiments of the present invention. In certain embodiments, the length 1220 of the rectangular support structure may be the same as the length (not shown) of a break (430 of FIG. 4 and FIG. 5). In other embodiments, the length 1220 of the rectangular support structure (1110 of FIG. 11) may be smaller than a length (not shown) of a break (430 of FIG. 4 and FIG. 5). In still other embodiments, the length 1220 of the rectangular support structure (1110 of FIG. 11) may be larger than a length (not shown) of a break (430 of FIG. 4 and FIG. 5). One of ordinary skill in the art will recognize that the length 1220 of the rectangular support structure (1110 of FIG. 11) may vary based on an application or a design in accordance with one or more embodiments of the present invention.

In FIG. 12B, a substantially circular support structure (1110 of FIG. 11) is depicted. The circular support structure (1110 of FIG. 11) may have a diameter 1230 that may vary based on an application or a design. In certain embodiments, the diameter 1230 of the circular support structure (1110 of FIG. 11) may be the same as the width (910 of FIG. 9) of one or more lines or features (830 of FIG. 11). In other embodiments, the diameter 1230 of the circular support structure (1110 of FIG. 11) may be smaller than the width (910 of FIG. 9) of one or more lines or features (830 of FIG. 11). In still other embodiments, the diameter 1230 of the circular support structure (1110 of FIG. 11) may be larger than the width (910 of FIG. 9) of one or more lines or features (830 of FIG. 11). One of ordinary skill in the art will recognize that the diameter 1230 of the circular support structure (1110 of FIG. 11) may vary based on an application or a design in accordance with one or more embodiments of the present invention. In certain embodiments, the diameter 1230 of the circular support structure (1110 of FIG. 11) may be the same as the length (not shown) of one or more breaks (430 of FIG. 4 and FIG. 5). In other embodiments, the diameter 1230 of the circular support structure (1110 of FIG. 11) may be smaller than the length (not shown) of one or more breaks (430 of FIG. 4 and FIG. 5). In still other embodiments, the diameter 1230 of the circular support structure (1110 of FIG. 11) may be larger than the length (not shown) of one or more breaks (430 of FIG. 4 and FIG. 5). One of ordinary skill in the art will recognize that the diameter 1230 of the circular support structure (1110 of FIG. 11) may vary based on an application or a design in accordance with one or more embodiments of the present invention.

In FIG. 12C, a substantially oval support structure (1110 of FIG. 11) is depicted. The oval support structure (1110 of FIG. 11) may have a minor diameter 1240 and a major diameter 1250 that may vary based on an application or a design. In certain embodiments, the minor diameter 1240 of the oval support structure (1110 of FIG. 11) may be the same as the width (910 of FIG. 9) of one or more lines or features (830 of FIG. 11). In other embodiments, the minor diameter 1240 of the oval support structure (1110 of FIG. 11) may be smaller than the width (910 of FIG. 9) of one or more lines or features (830 of FIG. 11). In still other embodiments, the minor diameter 1240 of the oval support structure (1110 of FIG. 11) may be larger than the width (910 of FIG. 9) of one or more lines or features (830 of FIG. 11). One of ordinary skill in the art will recognize that the minor diameter 1240 of the oval support structure (1110 of FIG. 11) may vary based on an application or a design in accordance with one or more embodiments of the present invention. In certain embodiments, the major diameter 1250 of the oval support structure (1110 of FIG. 11) may be the same as the length (not shown) of one or more breaks (430 of FIG. 4 and FIG. 5). In other embodiments, the major diameter 1250 of the oval support structure (1110 of FIG. 11) may be smaller than the length (not shown) of one or more breaks (430 of FIG. 4 and FIG. 5). In still other embodiments, the major diameter 1250 of the oval support structure (1110 of FIG. 11) may be larger than the length (not shown) of one or more breaks (430 of FIG. 4 and FIG. 5). One of ordinary skill in the art will recognize that the major diameter 1250 of the oval support structure (1110 of FIG. 11) may vary based on an application or a design in accordance with one or more embodiments of the present invention.

In FIG. 12D, a substantially square support structure (1110 of FIG. 11) is depicted. The square support structure (1110 of FIG. 11) may have a width 1260 and a length 1270 that may vary based on an application or a design. In certain embodiments, the width 1260 of the square support structure may be the same as the width (910 of FIG. 9) of one or more lines or features (830 of FIG. 11). In other embodiments, the width 1260 of the square support structure may be smaller than the width (910 of FIG. 9) of one or more lines or features (830 of FIG. 11). In other embodiments, the width 1260 of the square support structure may be larger than the width (910 of FIG. 9) of one or more lines or features (830 of FIG. 11). One of ordinary skill in the art will recognize that the width 1260 of the square support structure (1110 of FIG. 11) may vary based on an application or a design in accordance with one or more embodiments of the present invention. In certain embodiments, the length 1270 of the square support structure may be the same as the length (not shown) of a break (430 of FIG. 4 and FIG. 5). In other embodiments, the length 1270 of the square support structure (1110 of FIG. 11) may be smaller than a length (not shown) of a break (430 of FIG. 4 and FIG. 5). In other embodiments, the length 1270 of the square support structure (1110 of FIG. 11) may be larger than a length (not shown) of a break (430 of FIG. 4 and FIG. 5). One of ordinary skill in the art will recognize that the length 1270 of the square support structure (1110 of FIG. 11) may vary based on an application or a design in accordance with one or more embodiments of the present invention.

Figure 13A:
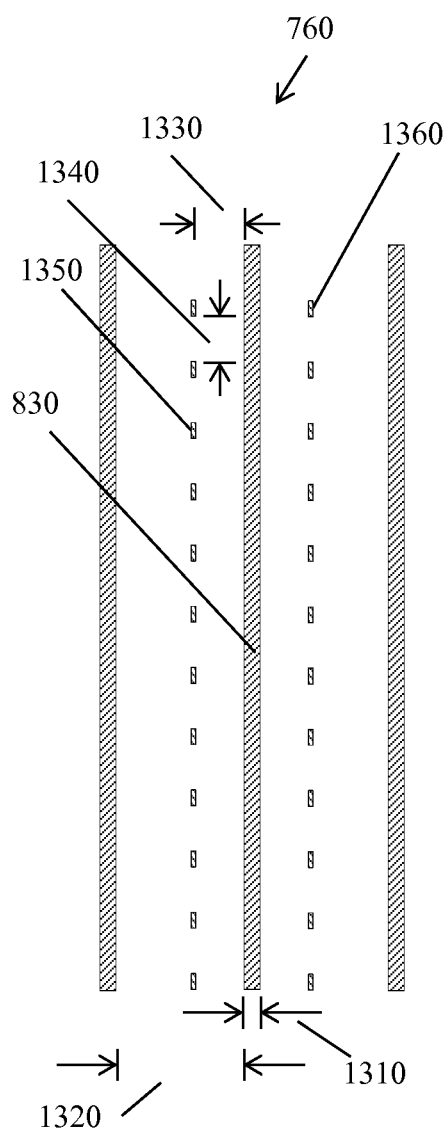
FIG. 13A shows a top-view of a portion of a flexographic printing plate with a plurality of support structures disposed on both sides of a line or feature that are substantially aligned with respect to each other in accordance with one or more embodiments of the present invention.

In FIG. 13A, a top view of a portion of a flexographic printing plate 760 showing three lines or features 830 is depicted. One of ordinary skill in the art will recognize that flexographic printing plate 760 may include a plurality of lines or features 830 configured to print a plurality of lines or features (not shown) on substrate (310 of FIG. 7) as part of a precursor mesh (not shown) that may be used to form a conductive mesh (320 or 330 of FIG. 3) or a direct-printed conductive mesh (320 or 330 of FIG. 3).

In certain embodiments, line or feature 830 may have a width 1310 less than 5 micrometers. In other embodiments, line or feature 830 may have a width 1310 in a range between approximately 5 micrometers and approximately 10 micrometers. In still other embodiments, line or feature 830 may have a width 1310 in a range between approximately 10 micrometers and approximately 50 micrometers. In still other embodiments, line or feature 830 may have a width 1310 greater than approximately 50 micrometers. One of ordinary skill in the art will recognize that the width 1310 of lines or features 830 may vary based on an application or a design in accordance with one or more embodiments of the present invention.

In certain embodiments, the line-to-line spacing 1320 between lines or features 830 may be less 200 micrometers. In other embodiments, the line-to-line spacing 1320 between lines or features 830 may be in a range between approximately 200 micrometers and approximately 400 micrometers. In still other embodiments, the line-to-line spacing 1320 between lines or features 830 may be in a range between approximately 400 micrometers and approximately 600 micrometers. In still other embodiments, the line-to-line spacing 1320 between lines or features 830 may be greater than 600 micrometers. One of ordinary skill in the art will recognize that the line-to-line spacing 1320 between lines or features 830 may vary based on an application or a design in accordance with one or more embodiments of the present invention.

In certain embodiments, a plurality of support structures 1350 may be disposed on a first side of line or feature 830 and a plurality of support structures 1360 may be disposed on a second side of line or feature 830. Support structures 1350 and support structures 1360 may be substantially aligned with respect to each other. In other embodiments, the plurality of support structures 1350 may be disposed on a first side of line or feature 830 and support structures 1360 may not be used. In still other embodiments, support structures 1350 may not be used and the plurality of support structures 1360 may be disposed on a second side of line or feature 830. One of ordinary skill in the art will recognize that the disposition of the plurality of support structures 1350 and/or the plurality of support structures 1360 may vary based on an application or design in accordance with one or more embodiments of the present invention.

In certain embodiments, the plurality of support structures 1350 and/or the plurality of support structures 1360 may have a width (not shown) that may be substantially similar to that of the width 1310 of lines or features 830. In other embodiments, the plurality of support structures 1350 and/or the plurality of support structures 1360 may have a width that is smaller than the width 1310 of lines or features 830. In embodiments where the width of the support structures is smaller than the width 1310 of lines or features 830, the smaller width of the support structures may reduce the visual appearance of the support structures to an end user under normal operating conditions. In still other embodiments, the plurality of support structures 1350 and/or the plurality of support structures 1360 may have a width that is larger than the width 1310 of lines or features 830. One of ordinary skill in the art will recognize that the width of the plurality of support structures 1350 and/or the plurality of support structures 1360 may vary based on an application or design in accordance with one or more embodiments of the present invention.

In certain embodiments, the plurality of support structures 1350 may be placed at an offset 1330 from the first side of line or feature 830. Similarly, the plurality of support structures 1360 may be placed at an offset 1330 from the second side of line or feature 830. The offset 1330 may impact the waviness and visual appearance of line or feature 830. If the offset 1330 is small such that the support structures are placed too close to line or feature 830, line or feature 830 may have substantially reduced or eliminated waviness, but appear more visually apparent to an end user under normal operating conditions. If the offset 1330 is large such that the support structures are placed too far from line or feature 830, line or feature 830 may still exhibit an unacceptable degree of waviness. As such, offset 1330 may be selected to provide an appropriate amount of support necessary to reduce waviness and not make line or feature 830 more visually apparent to an end user under normal operating conditions.

In certain embodiments, offset 1330 may be less than 10 micrometers. In other embodiments, offset 1330 may be in a range between approximately 10 micrometers and approximately 100 micrometers. In still other embodiments, offset 1330 may be greater than 100 micrometers. One of ordinary skill in the art will recognize that offset 1330 may vary based on an application or design in accordance with one or more embodiments of the present invention.

In certain embodiments, offset 1330 may be measured as a fraction of the line-to-line spacing 1320 between lines or features 830. In certain embodiments, offset 1330 may be less than 25 percent of the line-to-line spacing 1320. In other embodiments, offset 1330 may be in a range between approximately 25 percent and approximately 33 percent of the line-to-line spacing 1320. In still other embodiments, offset 1330 may be greater than 33 percent of the line-to-line spacing 1320. One of ordinary skill in the art will recognize that offset 1330 may vary based on an application or design in accordance with one or more embodiments of the present invention.

In certain embodiments, the plurality of support structures 1350 may be placed with a support structure-to-support structure spacing 1340 between adjacent support structures 1350. Similarly, the plurality of support structures 1360 may be placed with a support structure-to-support structure spacing 1340 between adjacent support structures 1360. The support structure-to-support structure spacing 1340 may impact the waviness and visual appearance of the support structures themselves and/or line or feature 830. If the support structure-to-support structure spacing 1340 is small such that the support structures are placed too close to one another, line or feature 830 may have substantially reduced or eliminated waviness, but the support structures themselves and/or line or feature 830 may appear more visually apparent to an end user under normal operating conditions. If the support structure-to-support structure spacing 1340 is large such that the support structures are placed too far for one another, line or feature 830 may still exhibit waviness. As such, support structure-to-support structure spacing 1340 may be selected to provide an appropriate amount of support necessary to reduce waviness and not make the support structures themselves or line or feature 830 more visually apparent to an end user under normal operating conditions.

In certain embodiments, support structure-to-support structure spacing 1340 may be less than 10 micrometers. In other embodiments, support structure-to-support structure spacing 1340 may be in a range between approximately 10 micrometers and approximately 200 micrometers. In still other embodiments, support structure-to-support structure spacing 1340 may be greater than 200 micrometers. One of ordinary skill in the art will recognize that support structure-to-support structure spacing 1340 may vary based on an application or design in accordance with one or more embodiments of the present invention. In certain embodiments, support structure-to-support structure spacing 1340 may correspond to a length of line or feature 830 between successive breaks (430 of FIG. 4 and FIG. 5) along its length.

While the depicted support structures 1350 and 1360 are substantially rectangular support structures (FIG. 12A), one of ordinary skill in the art will recognize that the shape of support structures 1350 and/or 1360 may be vary based on an application or design in accordance with one or more embodiments of the present invention.

Figure 13B:
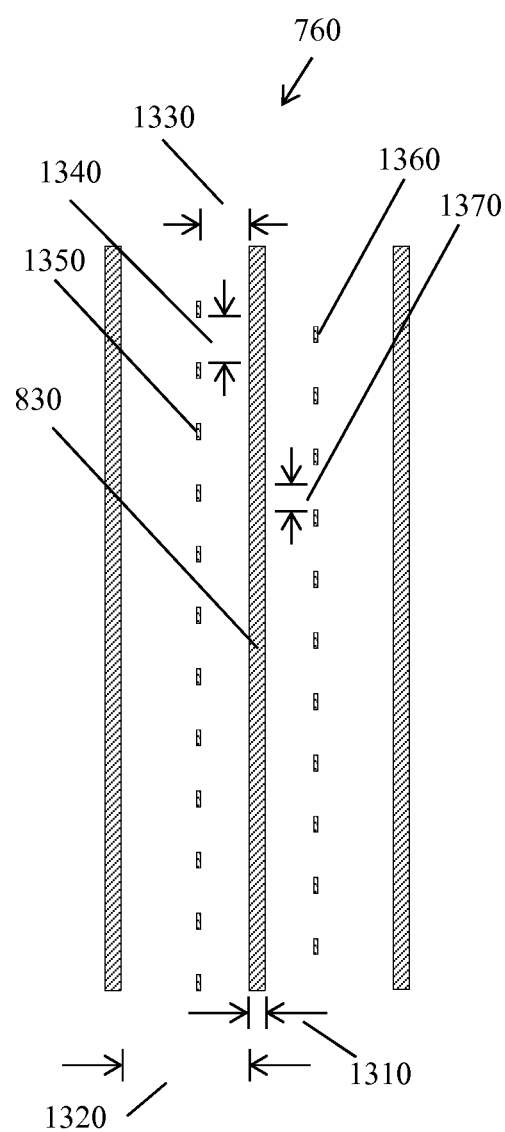
FIG. 13B shows a top-view of a portion of a flexographic printing plate with a plurality of support structures disposed on both sides of a line or feature that are offset relative to each other in accordance with one or more embodiments of the present invention.

In the embodiment depicted in FIG. 13B, a plurality of support structures 1350 may be disposed on a first side of line or feature 830 and a plurality of support structures 1360 may be disposed on a second side of line or feature 830. Support structures 1360 may be offset 1370 relative to support structures 1350. The offset 1370 may impact the waviness and visual appearance of the support structures themselves and/or line or feature 830. A given support structure tends to pull a wavy line in the direction of the support structure. By placing support structures that are offset 1370 from one another on opposing sides of a line or feature 830, a pulling effect may be applied on opposing sides of line or feature 830 and may reduce the waviness of line or feature 830. As such, in such an embodiment, offset 1370 may be selected to provide an appropriate amount of support necessary to reduce waviness and not make the support structures themselves and/or line or feature 830 more visually apparent to an end user under normal operating conditions.

In certain embodiments, offset 1370 may be less than 10 micrometers. In other embodiments, offset 1370 may be in a range between approximately 10 micrometers and approximately 100 micrometers. In still other embodiments, offset 1370 may be greater than 100 micrometers. One of ordinary skill in the art will recognize that offset 1370 may vary based on an application or design in accordance with one or more embodiments of the present invention.

Figure 14:
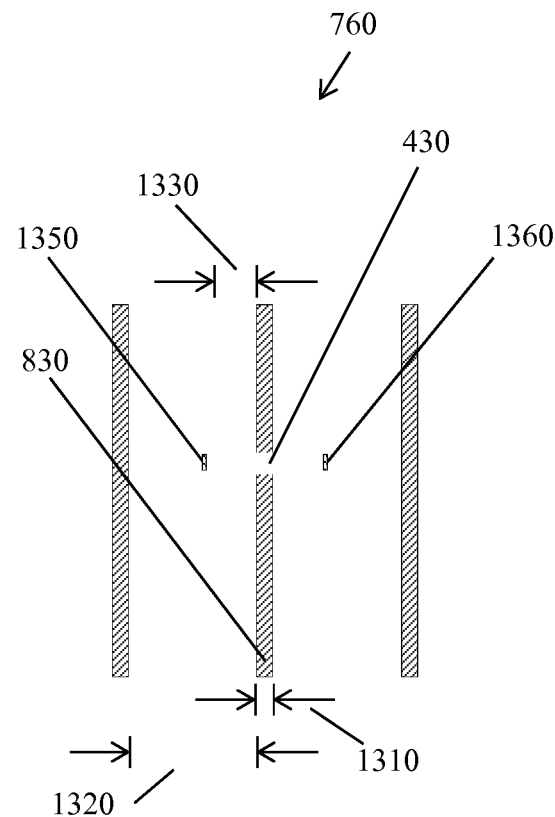
FIG. 14 shows a top-view of a portion of a flexographic printing plate with support structures offset from breaks in accordance with one or more embodiments of the present invention.

FIG. 14 shows a top-view of a portion of a flexographic printing plate with support structures offset from breaks in accordance with one or more embodiments of the present invention. A zoomed in portion of flexographic printing plate 760 shows three lines or features 830. One of ordinary skill in the art will recognize that flexographic printing plate 760 may include a plurality of lines or features 830 configured to print a plurality of lines or features on substrate (310 of FIG. 7) as part of a precursor mesh (not shown) that may be used to form a conductive mesh (320 or 330 of FIG. 3) or a direct-printed conductive mesh (320 or 330 of FIG. 3). One or more lines or features 830 may include one or more breaks 430 that may facilitate the partitioning of the precursor mesh (not shown) and the corresponding conductive mesh (320 or 330 of FIG. 3) into a plurality of transmit lines (210 of FIG. 4) and/or a plurality of receive lines (220 of FIG. 5).

In FIG. 14, a single break 430 is depicted to facilitate understanding, however, in typical embodiments, a plurality of breaks 430 may be distributed among one or more of the plurality of lines or features 830. While breaks 430 may be necessary for the partitioning of the precursor mesh (not shown), one or more breaks 430 may contribute to increased waviness in lines or features 830. In addition, the plurality of breaks 430 tend to visually add up when viewing a conductive mesh (320 or 330 of FIG. 3), such that the eye is drawn to a virtual blank line formed by the breaks 430 (for example, see FIG. 4 or FIG. 5). In certain embodiments, support structure 1350 may be disposed on a first side of line or feature 830 and support structure 1360 may be disposed on a second side of line or feature 830. Support structure 1350 and support structure 1360 may be sized and aligned relative to the size and alignment of one or more breaks 430. By sizing and aligning the support structures with one or more breaks 430, the breaks 430 reduce or eliminate the appearance of the virtual blank line formed by the breaks 430. To an end user under normal operating conditions, there is no visually apparent virtual blank line formed by the breaks. Support structure 1350 and support structure 1360 may be substantially aligned with respect to each other or offset relative to one another. In other embodiments, support structure 1350 may be disposed on a first side of line or feature 830 and support structure 1360 may not be used. Similar to the above, by sizing and aligning the support structure 1350 with one or more breaks 430, the breaks 430 reduce or eliminate the appearance of the virtual blank line formed by the breaks 430. In still other embodiments, support structure 1350 may not be used and support structure 1360 may be disposed on a second side of line or feature 830. Similar to the above, by sizing and aligning the support structure 1360 with one or more breaks 430, the breaks 430 reduce or eliminate the appearance of the virtual blank line formed by the breaks 430. One of ordinary skill in the art will recognize that the disposition of support structure 1350 and/or support structure 1360 may vary based on an application or design in accordance with one or more embodiments of the present invention.

Figure 15:
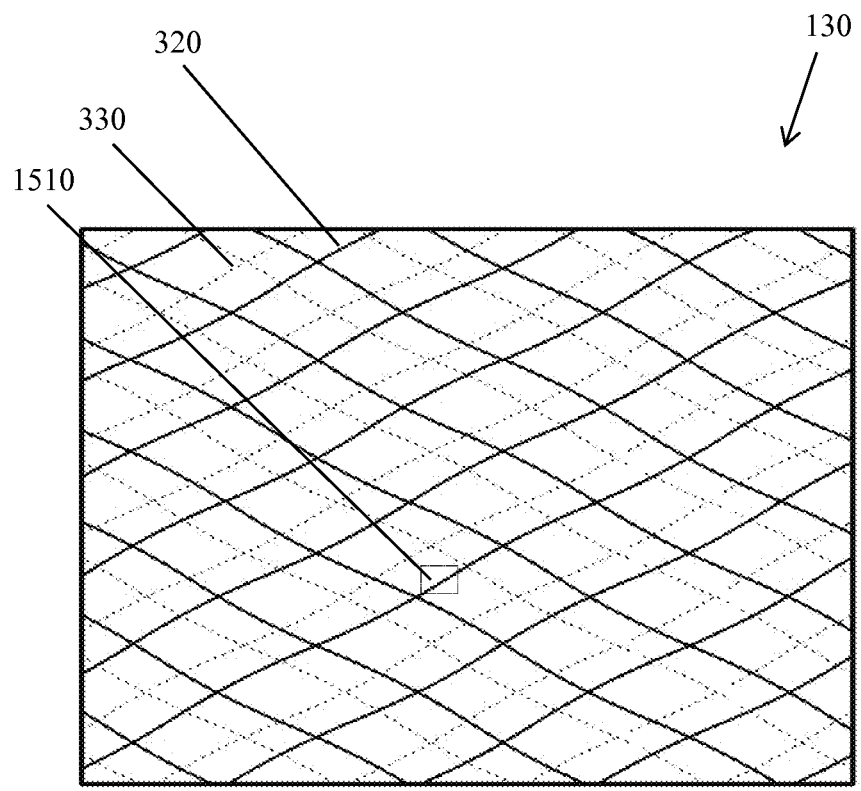
FIG. 15 shows a portion of a touch sensor exhibiting a reduction in waviness in accordance with one or more embodiments of the present invention.
Figure 15:
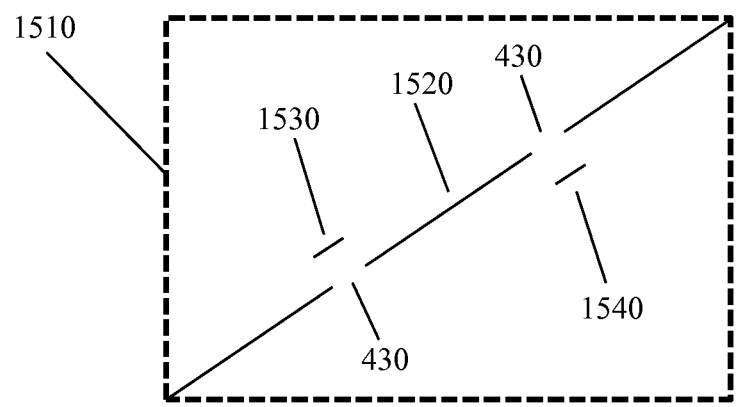

FIG. 15 shows a portion of a touch sensor exhibiting a reduction in waviness in accordance with one or more embodiments of the present invention. The portion of touch sensor 130 depicted includes conductive mesh 320 and conductive mesh 330 disposed on opposing sides of a substrate (310 of FIG. 3) that exhibit a substantial reduction in the waviness of their respective conductive lines. A zoomed in portion 1510 of conductive mesh 320 shows conductive line or feature 1520, that may be formed by metallizing a line or feature printed by line or feature 830 of flexographic printing plate 760 of FIG. 7 or direct-printed by line or feature 830 using a conductive ink, that includes a plurality of breaks 430 along its length.

In certain embodiments, support feature 1530 may be disposed on a first side of conductive line or feature 1520 and/or support feature 1540 may be disposed on a second side of conductive line or feature 1520. The support structures may be sized and aligned relative to a size and an alignment of one or more breaks 430. By placing support structures on opposing sides of conductive line or feature 1520 that are offset from one another, a pulling effect may be applied on opposing sides of conductive line or feature 1520 that may reduce or eliminate the waviness of conductive line or feature 1520. In other embodiments, support feature 1530 and support feature 1540 may both be disposed on a first side of conductive line or feature 1520. In still other embodiments, support feature 1530 and support feature 1540 may both be disposed on a second side of conductive line or feature 1520. One of ordinary skill in the art will recognize that the size, alignment, placement and number of support structures may vary based on a design or application in accordance with one or more embodiments of the present invention.

Figure 16:
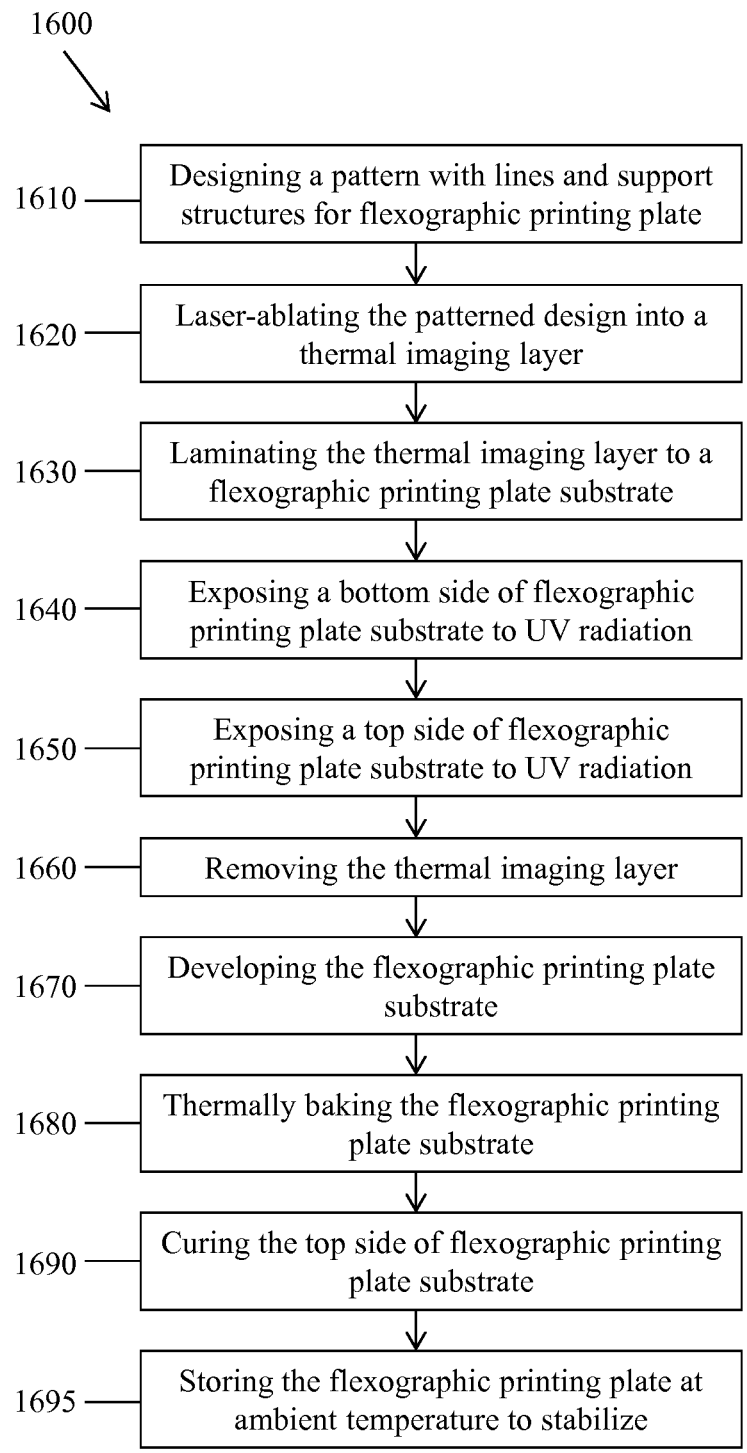
FIG. 16 shows a method of manufacturing a flexographic printing plate with support structures in accordance with one or more embodiments of the present invention.

FIG. 16 shows a method of manufacturing a flexographic printing plate with support structures in accordance with one or more embodiments of the present invention. In step 1610, a patterned design may be designed in a software application, such as a computer-aided drafting ("CAD") software application. The patterned design includes an embossing pattern to be formed in a flexographic printing plate that, when used as part of a flexographic printing process, prints a corresponding patterned design on a substrate. The patterned design include a plurality of lines or features and a plurality of support structures that, when printed on the substrate, may form at least a portion of a precursor mesh that may be electroless plated to form a conductive mesh on the substrate or direct-printed with a conductive ink to form a conductive mesh on the substrate.

In one or more embodiments of the present invention, the plurality of support structures of the patterned design may be isolated from, or otherwise not connected to, the plurality of lines or features of the patterned design. As a consequence, the plurality of support structures of the flexographic printing plate ultimately formed may be isolated from, or otherwise not connected to, the plurality of lines or features of the flexographic printing plate. In this way, the plurality of support structures may provide a support function, but do not contribute to, or otherwise play a role in, the connectivity of the plurality of lines or features.

In step 1620, the patterned design may be laser-ablated into a thermal imaging layer. The thermal imaging layer includes a PET base layer covered by a laser-ablation coating layer. The laser-ablation process ablates portions of the laser-ablation coating layer in a pattern corresponding to the patterned design, but the ablation does not extend into the PET base layer. After laser-ablation, the thermal imagining layer includes the PET base layer and remaining portions of the laser-ablation coating layer, where the exposed portions of the PET base layer correspond to the patterned design.

In step 1630, the thermal imaging layer may be laminated to a flexographic printing plate substrate. The flexographic printing plate substrate includes a PET base layer covered by a photo-sensitive polymer layer. The thickness of the flexographic printing plate substrate may vary. For example, flexographic printing plate substrates are commonly produced with a thickness of 1.14 millimeters or 1.67 millimeters. The PET base layer of the flexographic printing plate substrate may have a thickness in a range between approximately 50 micrometers and 200 micrometers, with the remaining thickness attributed to the thickness of the photo-sensitive polymer layer. The laser-ablation coating layer side of the thermal imaging layer is laminated to a top side, or photo-sensitive polymer layer side, of the flexographic printing plate substrate.

In step 1640, a bottom side of the flexographic printing plate substrate may be exposed to UV radiation to set a relief depth. The bottom side, or PET base layer side, of the flexographic printing plate may be exposed to UV-A radiation, or another wavelength suitable for use with a given type of photo-sensitive polymer material, for a period of time in a range between approximately 15 seconds and approximately 60 seconds, depending on the thickness of the flexographic printing plate substrate and the desired relief depth.

In step 1650, the top side of the flexographic printing plate substrate is exposed to UV radiation to crosslink and polymerize the patterned design into the photo-sensitive polymer layer. The top side of the flexographic printing plate substrate, through the thermal imaging layer, is exposed to UV-A radiation for a period of time in a range between approximately 5 minutes and approximately 30 minutes, depending on the thickness of the flexographic printing plate substrate and the desired relief depth. The conventional flexographic printing plate substrate materials are negatively photoactive when exposed to UV radiation. Thus, the exposed areas of the photo-sensitive polymer layer remain on the PET base layer while the unexposed areas of the photo-sensitive polymer layer are removed in the wet chemical wash and development step. In step 1660, the thermal imaging layer may be removed by physically delaminating it from the flexographic printing plate substrate.

In step 1670, the flexographic printing plate substrate may be developed. The flexographic printing plate substrate may be developed with a washout liquid, such as a solvent or etchant, which removes the unexposed portions of the photo-sensitive polymer layer and leaves the UV-exposed portions of the photo-sensitive polymer layer in a pattern corresponding to the patterned design. In step 1680, the flexographic printing plate substrate may be thermally baked at a temperature in a range between approximately 50 degrees Celsius and approximately 60 degrees Celsius for a period of time in a range between approximately 1 hour and approximately 3 hours. In step 1690, the flexographic printing plate may be cured to complete the polymerization of the flexographic printing plate, including the sides of the structures, after the wet wash and development step. The top side of the flexographic printing plate substrate may be exposed to UV-A radiation for a period of time in a range between approximately 0.5 minutes and approximately 5 minutes and then may be exposed to UV-C radiation for a period of time in a range between approximately 5 minutes and approximately 25 minutes to control the ink wettability requirements. In step 1695, the flexographic printing plate may be stored for more than 8 hours at ambient temperatures to stabilize the plate, which is typically swollen from the solvent or etchant step of the manufacturing process. After storing, the flexographic printing plate may be mounted to a printing plate cylinder for use in a flexographic printing system.

While method 1600 includes support structures that reduce waviness, the exposure process may limit the ability to control the relief depth between lines or features of the flexographic printing plate substrate.

In one or more embodiments of the present invention, another method of manufacturing a flexographic printing plate with support structures may control the relief depth by a multi-step exposure process that provides strong and stable lines or features having micrometer-fine widths. When printing high-resolution lines or features with a line or feature width of 10 micrometers or less, the relief depth must be substantially shallower than that conventionally used. By reducing the relief depth, the base of the photo-sensitive polymer layer of the flexographic printing plate is thicker and provides improved support and stability to the high-resolution embossing patterns of the flexographic printing plate. The improved support and stability helps reduce or eliminate waviness, smearing, and uneven ink distribution. In addition, the improved support and stability reduces flexographic printing plate distortion when mounted to a printing plate cylinder.

Figure 17A:
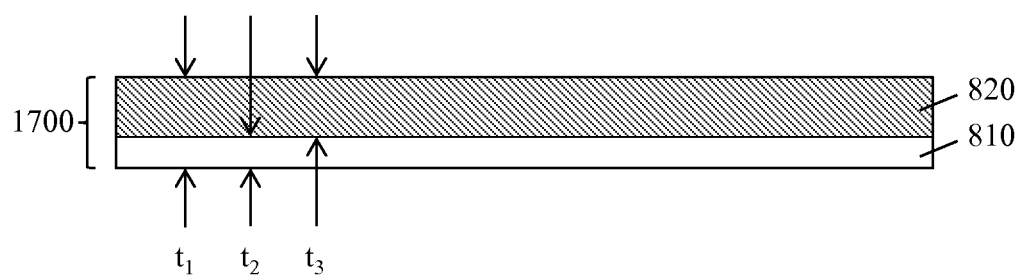
FIG. 17A shows a flexographic printing plate substrate in accordance with one or more embodiments of the present invention.
Figure 17B:
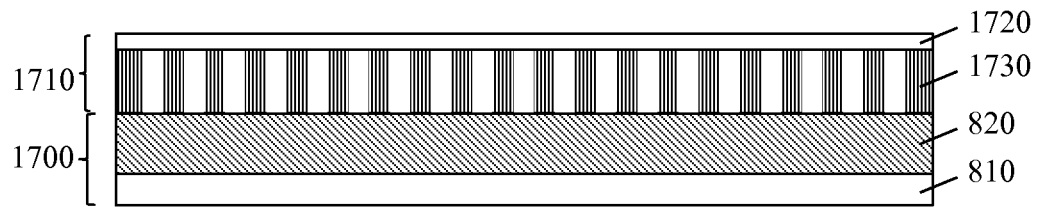
FIG. 17B shows a thermal imaging layer laminated to the flexographic printing plate substrate in accordance with one or more embodiments of the present invention.

FIGS. 17A and 17B show a flexographic printing plate substrate at early stages of manufacture in accordance with one or more embodiments of the present invention. In FIG. 17A, a flexographic printing plate substrate 1700 may be provided by a commercial vendor of flexographic printing plate substrates or custom manufactured for a specific design. Flexographic printing plate substrate 1700 may include a base layer 810 that provides some manner of rigidity covered by a photo-sensitive polymer layer 820 that is eventually patterned with a patterned design (not shown) that includes a plurality of lines or features and a plurality of support structures that, when printed on the substrate, may form at least a portion of a precursor mesh that may be electroless plated to form a conductive mesh on the substrate or direct-printed with a conductive ink to form a conductive mesh on the substrate. Though these support structures may also get plated, because the support structures are islands isolated from the plurality of lines or features, they do not have any negative impact on the electrical performance and may improve the optical performance. In certain embodiments, base layer 810 may be composed of a transparent and flexible PET material. In other embodiments, base layer 810 may be composed of PEN or other optically transparent and flexible film substrates. One of ordinary skill in the art will recognize that the composition of base layer 810 may vary in accordance with one or more embodiments of the present invention.

In certain embodiments, flexographic printing plate substrate 1700 may have a length and a width suitable for mounting to an 18 inch printing plate cylinder. In other embodiments, flexographic printing plate substrate 1700 may have a length and a width suitable for mounting to a 24 inch printing plate cylinder. One of ordinary skill in the art will recognize that the length and the width of flexographic printing plate substrate 1700 may vary based on an application in accordance with one or more embodiments of the present invention.

In certain embodiments, flexographic printing plate substrate 1700 may have a thickness, $t_1$, of approximately 1.14 millimeters. In other embodiments, flexographic printing plate substrate 400 may have a thickness, $t_1$, of approximately 1.67 millimeters. In still other embodiments, flexographic printing plate substrate 1700 may have a custom thickness, $t_1$, corresponding to a specific design or application. One of ordinary skill in the art will recognize that the thickness, $t_1$, of flexographic printing plate substrate 1700 may vary in accordance with the composition of substrate 1700, a specific design, or application. In certain embodiments, base layer 810 may have a thickness, $t_2$, in a range between approximately 100 micrometers and approximately 200 micrometers. One of ordinary skill in the art will recognize that the thickness, $t_2$, of base layer 810 may vary based on the composition of base layer 810, a specific design, or application. The remaining thickness, $t_3$, of flexographic printing plate substrate 1700 may be attributed to the thickness of photo-sensitive polymer layer 820. The maximum possible relief depth (not shown) of the patterned design (not shown) that is eventually patterned into photo-sensitive polymer layer 820 may be determined by the thickness, $t_3$, of photo-sensitive polymer layer 820.

Continuing in FIG. 17B, thermal imaging layer 1710 may be laminated to flexographic printing plate substrate 1700. Thermal imaging layer 1710 may be composed of a PET base layer 1720 that provides some manner of rigidity covered by a laser-ablation coating layer 1730 that may be patterned by a laser-ablation process. A patterned design (not shown) such as, for example, a pattern that includes a plurality of lines or features and a plurality of support structures that, when printed on the substrate, may form at least a portion of a precursor mesh that may be electroless plated to form a conductive mesh on the substrate or direct-printed with a conductive ink to form a conductive mesh on the substrate, may be laser-ablated into thermal imaging layer 1710. As such, the exposed portions of PET base layer 1720 of thermal imaging layer 1710 correspond to the patterned design (not shown).

The laser-ablation coating layer 1730 side of thermal imaging layer 1710 may be laminated to the photo-sensitive polymer layer 820 side of flexographic printing plate substrate 1700 using standard lamination processes.

Figure 18A:
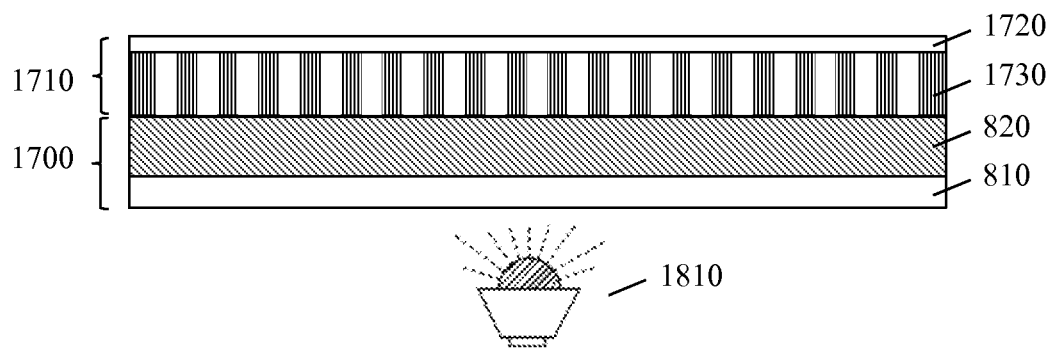
FIG. 18A shows a first bottom side UV radiation exposure of the flexographic printing plate substrate in accordance with one or more embodiments of the present invention.
Figure 18B:
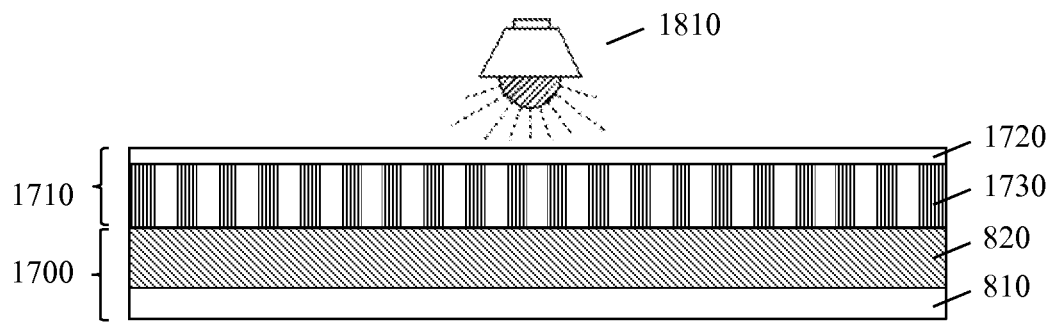
FIG. 18B shows a top side UV radiation exposure of the flexographic printing plate substrate in accordance with one or more embodiments of the present invention.
Figure 18C:
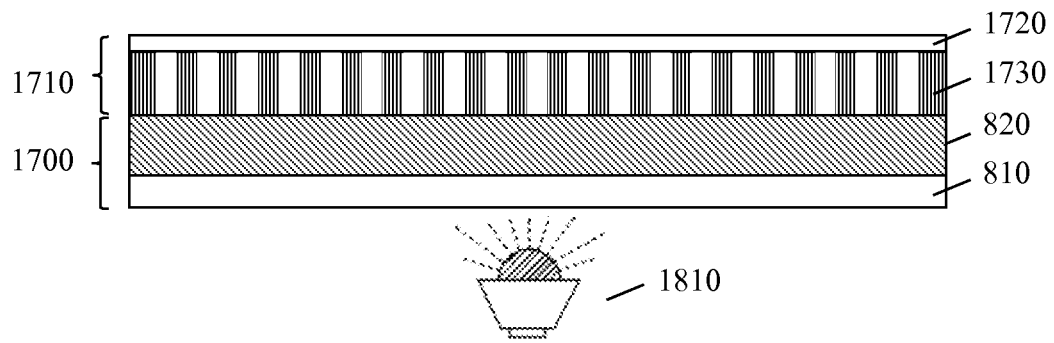
FIG. 18C shows a second bottom side UV radiation exposure of the flexographic printing plate substrate in accordance with one or more embodiments of the present invention.
Figure 19A:
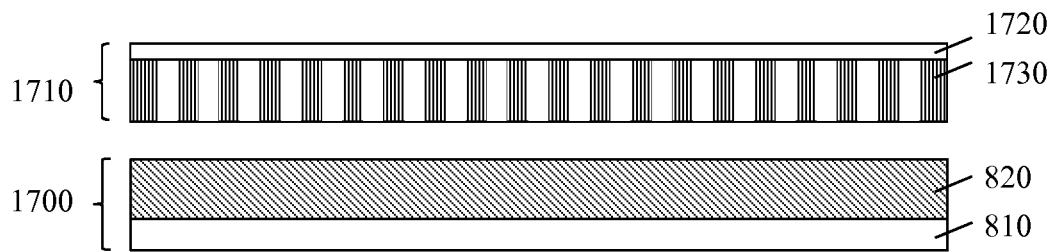
FIG. 19A shows the thermal imaging layer removed from the flexographic printing plate substrate in accordance with one or more embodiments of the present invention.
Figure 19B:
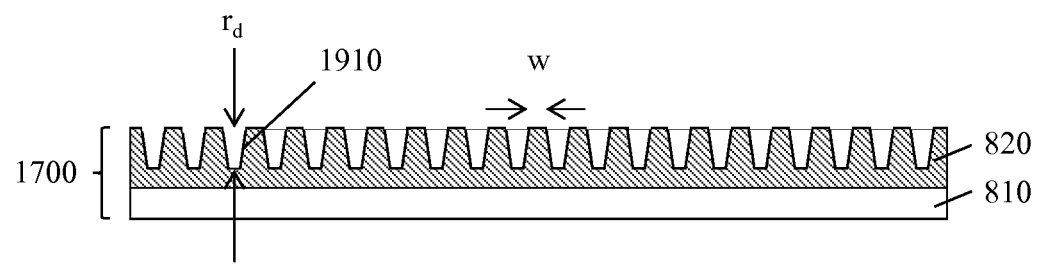
FIG. 19B shows a developed flexographic printing plate substrate in accordance with one or more embodiments of the present invention.
Figure 19C:
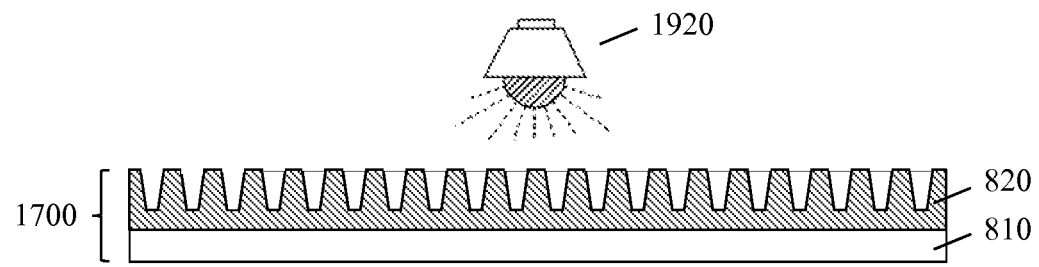
FIG. 19C shows top side UV radiation exposure of the developed flexographic printing plate substrate in accordance with one or more embodiments of the present invention.
Figure 19D:
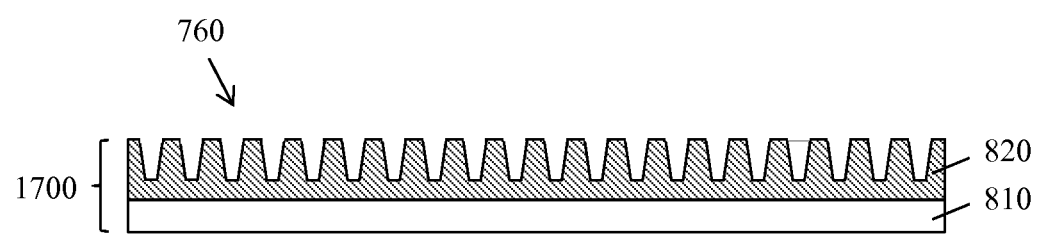
FIG. 19D shows a flexographic printing plate in accordance with one or more embodiments of the present invention.

FIGS. 18A through 18C show a multi-step exposure of the flexographic printing plate substrate in accordance with one or more embodiments of the present invention. Continuing in FIG. 18A, a bottom side, or base layer 810 side, of flexographic printing plate substrate 1700 may be exposed to UV-A radiation 1810, or another wavelength suitable for use with a given type of photo-sensitive polymer material, for a first time. The bottom side UV-A radiation 1810 may partially polymerize a portion of photo-sensitive polymer layer 820 from the bottom of photo-sensitive polymer layer 820, nearest base layer 810, towards the top of photo-sensitive polymer layer 820. The depth to which photo-sensitive polymer layer 820 is polymerized may depend on the exposure time and the ability of UV-A radiation 1810 to penetrate photo-sensitive polymer layer 820. In one or more embodiments of the present invention, this first bottom side UV-A radiation 1810 exposure time may be controlled so that a total bottom side UV-A radiation 1810 exposure time sets a desired relief depth. The total exposure time estimated to achieve the desired relief depth may be partitioned between this first bottom side UV-A radiation 1810 exposure time and a second bottom side UV-A radiation 1810 exposure time shown in FIG. 18C.

In certain embodiments, the first bottom side UV-A radiation 1810 exposure time as a percentage of the total bottom side UV-A radiation 1810 exposure time may be approximately 50 percent. In other embodiments, the first bottom side UV-A radiation 1810 exposure time as a percentage of the total bottom side UV-A radiation 1810 exposure time may be in range between approximately 10 percent and approximately 90 percent. One of ordinary skill in the art will recognize that the first bottom side UV-A radiation 1810 exposure time as a percentage of the total bottom side UV-A radiation 1810 exposure time may vary in accordance with one or more embodiments of the present invention. In certain embodiments, the bottom side of flexographic printing plate substrate 1700 may be first exposed to UV-A radiation 1810 for a period of time in a range between approximately 10 seconds and approximately 20 seconds. In other embodiments, the bottom side of flexographic printing plate substrate 1700 may be first exposed to UV-A radiation 1810 for a period of time in a range between approximately 20 seconds and approximately 40 seconds. One of ordinary skill in the art will recognize that the first bottom side UV-A radiation 1810 exposure time may vary in accordance with one or more embodiments of the present invention. In this way, this first bottom side UV-A radiation 1810 exposure may establish an initial relief depth controlled by the duration of the exposure. As such, subsequent bottom side UV-A radiation exposure 1810 may further decrease the relief depth in an additive manner to set the desired relief depth.

Continuing in FIG. 18B, a top side, or photo-sensitive polymer layer 820 side, of flexographic printing plate substrate 1700 may be exposed to UV-A radiation 1810, or another wavelength suitable for use with a given type of photo-sensitive polymer material, through thermal imaging layer 1710 to form the desired patterned design in photo-sensitive polymer layer 820. In certain embodiments, the top side of flexographic printing plate substrate 1700 may be exposed to UV-A radiation 1810 for a period of time in a range between approximately 200 seconds and approximately 1000 seconds. In other embodiments, the top side of flexographic printing plate substrate 1700 may be exposed to UV-A radiation 1810 for a period of time in a range between approximately 1000 seconds and approximately 2000 seconds. One of ordinary skill in the art will recognize that the top side UV-A radiation 1810 exposure time may vary in accordance with one or more embodiments of the present invention.

Continuing in FIG. 18C, the bottom side of flexographic printing plate substrate 1700 may be exposed to UV-A radiation 1810, or another wavelength suitable for use with a given type of photo-sensitive polymer material, for a second time. The bottom side UV-A radiation 1810 may partially polymerize a portion of photo-sensitive polymer layer 820. The depth to which photo-sensitive polymer layer 820 is polymerized may depend on the exposure time and the ability of the UV-A radiation 1810 to penetrate photo-sensitive polymer layer 820. In one or more embodiments of the present invention, the second bottom side UV-A radiation 1810 exposure time may be controlled so that the total bottom side UV-A radiation 1810 exposure time sets the desired relief depth. The total exposure time estimated to achieve the desired relief depth may be partitioned between the first bottom side UV-A radiation 1810 exposure time (FIG. 18A) and this second bottom side UV-A radiation 1810 exposure time.

In certain embodiments, the second bottom side UV-A radiation 1810 exposure time as a percentage of the total bottom side UV-A radiation 1810 exposure time may be approximately 50 percent. In other embodiments, the second bottom side UV-A radiation 1810 exposure time as a percentage of the total bottom side UV-A radiation 1810 exposure time may be in range between approximately 90 percent and approximately 10 percent. One of ordinary skill in the art will recognize that the second bottom side UV-A radiation 1810 exposure time as a percentage of the total bottom side UV-A radiation 1810 exposure time may vary in accordance with one or more embodiments of the present invention. In certain embodiments, the bottom side of flexographic printing plate substrate 1700 may be exposed to UV-A radiation 1810 for a period of time in a range between approximately 10 seconds and approximately 20 seconds. In other embodiments, the bottom side of flexographic printing plate substrate 1700 may be exposed to UV-A radiation 1810 for a period of time in a range between approximately 20 seconds and approximately 40 seconds. One of ordinary skill in the art will recognize that the second bottom side UV-A radiation 1810 exposure time may vary in accordance with one or more embodiments of the present invention. In certain embodiments, other combinations of multi-step exposure may be used to achieve repeatability, completion of polymerization of the photo-sensitive material, and improved stability of patterns with a desired target relief depth. For example, in some cases, a bottom/top/bottom/top/bottom multi-step exposure process may be used.

FIGS. 19A through 19D show post-exposure processing of the flexographic printing plate substrate in accordance with one or more embodiments of the present invention. Continuing in FIG. 19A, thermal imaging layer 1710 may be removed from flexographic printing plate substrate 1700 using standard delamination processes. Continuing in FIG. 19B, flexographic printing plate substrate 1700 may be developed. Flexographic printing plate substrate 1700 may be developed with a washout liquid, such as a solvent or etchant, which removes the unexposed (and unpolymerized) portions of photo-sensitive polymer layer 820 and leaves the UV-exposed portions of photo-sensitive polymer layer 820 in a pattern corresponding to the patterned design (not shown).

After development, the relief depth, $r_d$, may be measured from a top of photo-sensitive polymer layer 820 (the tips of the lines or features) and corresponds to the depth of the valleys 1910 formed in photo-sensitive polymer layer 820 between the remaining UV-exposed portions of photo-sensitive polymer layer 820. The remaining UV-exposed portions of photo-sensitive polymer layer 820 form the lines or features and support structures of the patterned design (not shown) and may have a width, w, of 10 micrometers or less. In certain embodiments, the relief depth, $r_d$, may be in a range between approximately 150 micrometers and approximately 300 micrometers. In other embodiments, the relief depth, $r_d$, may be in a range between approximately 20 micrometers and approximately 150 micrometers. In still other embodiments, the relief depth, $r_d$, may be in a range between approximately 300 micrometers and approximately 400 micrometers. One of ordinary skill in the art will recognize that the relief depth may vary based on a specific design or application.

The quality of an image printed on substrate may be determined by an aspect ratio of the line or feature or support structure width, w, to the relief depth, $r_d$, of the patterned flexographic printing plate. As the desired line or feature or support structure width, w, of the flexographic printing plate gets smaller, the relief depth, $r_d$, must be reduced to maintain the aspect ratio. Thus, when printing high-resolution lines, features, or support structures with a width less than 10 micrometers, the relief depth, $r_d$, must be substantially shallower than that conventionally used. By reducing the relief depth, $r_d$, the base of photo-sensitive polymer layer may be thicker and provides improved support and stability to the patterned design formed on the flexographic printing plate. The improved support and stability may reduce or eliminate waviness, smearing, and uneven ink distribution. The desired relief depth, $r_d$, may depend on the total bottom side exposure time.

After development, flexographic printing plate substrate 1700 may be thermally baked (not shown) at a temperature in a range between approximately 50 degrees Celsius and approximately 60 degrees Celsius for a period of time in a range between approximately 1 hour and approximately 3 hours. Continuing in FIG. 19C, the top side of flexographic printing plate substrate 1700 may be exposed to UV-A radiation for a period of time in a range between approximately 0.5 minutes and approximately 5 minutes to crosslink and strengthen the features, as needed. The top side of flexographic printing plate substrate 1700 may then be exposed to UV-C radiation to remove any remaining volatile organic compounds and other contaminates from the surface of flexographic printing plate substrate 1700, as needed. Flexographic printing plate substrate 1700 may be stored for 8 or more hours at ambient temperatures to stabilize the plate, which is typically swollen from the solvent or etchant step of the manufacturing process. Continuing in FIG. 19D, flexographic printing plate 760 may be mounted to a printing plate cylinder (750 of FIG. 7) for use in a flexographic printing system (700 of FIG. 7).

Figure 20:
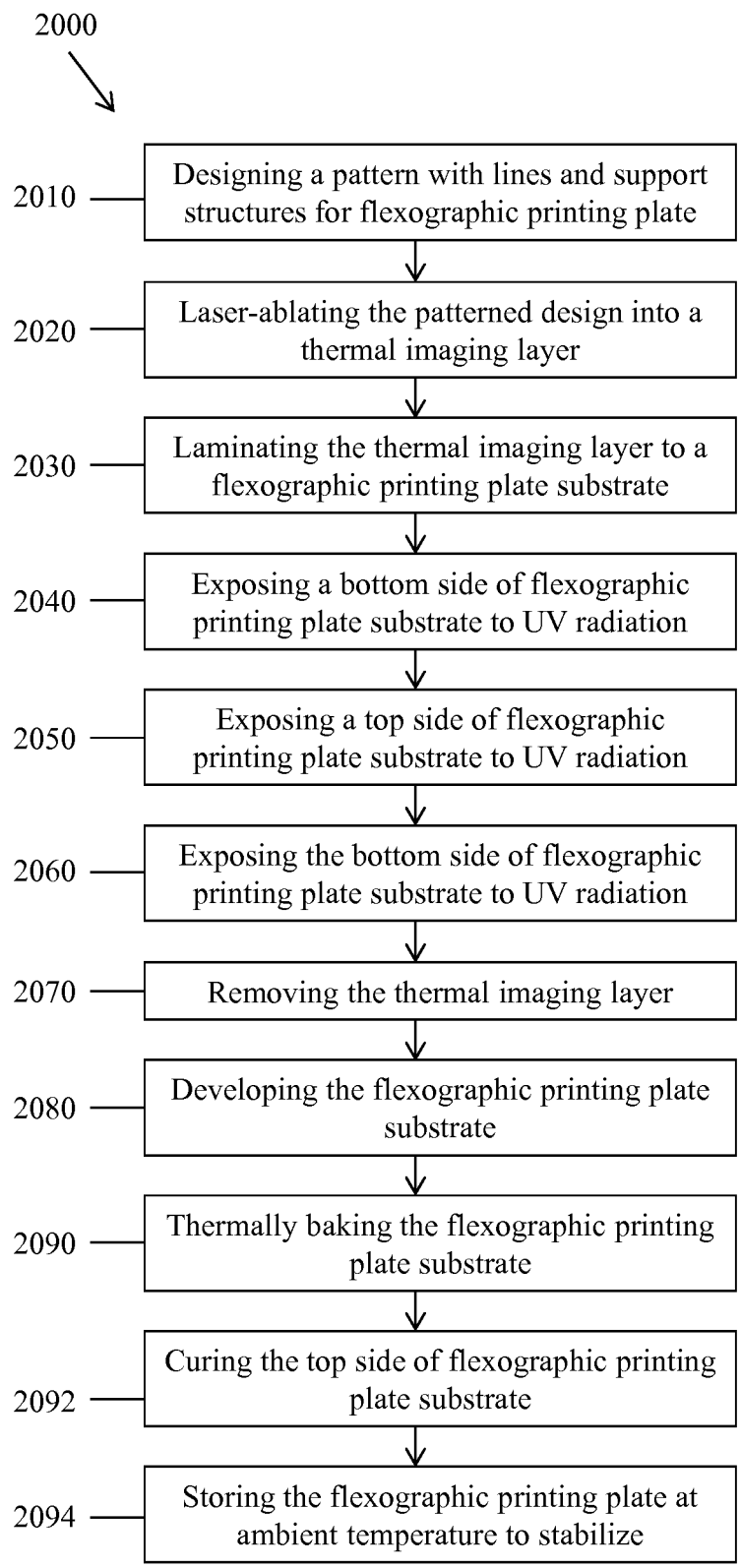
FIG. 20 shows a method of manufacturing a flexographic printing plate with support structures in accordance with one or more embodiments of the present invention.

FIG. 20 shows a method of manufacturing a flexographic printing plate with support structures in accordance with one or more embodiments of the present invention. The method 2000 may be used to manufacture a high-resolution flexographic printing plate (760 of FIG. 7) with support structures for use in a flexographic printing system (700 of FIG. 7) configured to print an ink image of the plurality of parallel lines or features on substrate (310 of FIG. 7) as part of a precursor mesh that may be electroless plated to form a conductive mesh (320 or 330 of FIG. 3) or a direct-printed conductive ink image of the plurality of parallel lines or features on substrate (310 of FIG. 7) as part of a conductive mesh (320 or 330 of FIG. 3).

In step 2010, a patterned design may be designed in a software application, such as a CAD software application. The patterned design includes an embossing pattern to be formed in a flexographic printing plate that, when used as part of a flexographic printing process, prints a corresponding patterned design on a substrate. The patterned design include a plurality of lines or features and a plurality of support structures that, when printed on the substrate, may form at least a portion of a precursor mesh that may be electroless plated to form a conductive mesh on the substrate or direct-printed with a conductive ink to form a conductive mesh on the substrate.

In one or more embodiments of the present invention, the plurality of support structures of the patterned design may be isolated from, or otherwise not connected to, the plurality of lines or features of the patterned design. As a consequence, the plurality of support structures of the flexographic printing plate ultimately formed may be isolated from, or otherwise not connected to, the plurality of lines or features of the flexographic printing plate. In this way, the plurality of support structures may provide a support function, but do not contribute to, or otherwise play a role in, the connectivity of the plurality of lines or features.

In step 2020, the patterned design may be laser-ablated into a thermal imaging layer. The thermal imaging layer includes a PET base layer covered by a laser-ablation coating layer. The laser-ablation process may ablate portions of the laser-ablation coating layer in a pattern corresponding to the patterned design, but does not extend into the PET base layer. After laser-ablation, the thermal imaging layer includes the PET base layer and remaining portions of the laser-ablation coating layer that is opaque. The exposed portions of the PET base layer of the thermal imaging layer correspond to the patterned design. In certain embodiments, the patterned design may be formed in a metal or opaque film patterned on flexible substrates or glass or other rigid transparent substrate photomask that is used instead of the thermal imaging layer.

In step 2030, the thermal imaging layer may be laminated to a flexographic printing plate substrate. The flexographic printing plate substrate may be provided by a commercial vendor of flexographic printing plate substrates or custom manufactured for a specific design. The flexographic printing plate substrate includes a base layer that provides some manner of rigidity covered by a photo-sensitive polymer layer that is eventually patterned with the patterned design. In certain embodiments, the base layer may be composed of a transparent and flexible PET material. In other embodiments, the base layer may be composed of PEN or other optically transparent and flexible film substrates. One of ordinary skill in the art will recognize that the composition of the flexographic printing plate base layer may vary in accordance with one or more embodiments of the present invention.

In certain embodiments, the flexographic printing plate substrate may have a length and a width suitable for mounting to an 18 inch printing plate cylinder. In other embodiments, the flexographic printing plate substrate may have a length and a width suitable for mounting to a 24 inch printing plate cylinder. One of ordinary skill in the art will recognize that the length and the width of the flexographic printing plate substrate may vary based on an application in accordance with one or more embodiments of the present invention.

In certain embodiments, the flexographic printing plate substrate may have a thickness of approximately 1.14 millimeters. In other embodiments, the flexographic printing plate substrate may have a thickness of approximately 1.67 millimeters. In still other embodiments, the flexographic printing plate substrate may have a custom thickness corresponding to a specific design or application. One of ordinary skill in the art will recognize that the thickness of the flexographic printing plate substrate may vary in accordance with the composition of the flexographic printing plate substrate, a specific design, or application. In certain embodiments, the flexographic printing plate base layer may have a thickness in a range between approximately 100 micrometers and approximately 200 micrometers. One of ordinary skill in the art will recognize that the thickness of the flexographic printing plate base layer may vary based on the composition of the base layer, a specific design, or application. The remaining thickness of the flexographic printing plate substrate may be attributed to the thickness of the photo-sensitive polymer layer. The maximum possible relief depth of the patterned design that is eventually patterned into the photo-sensitive polymer layer may be determined by the thickness of the photo-sensitive polymer layer. The laser-ablation coating layer side of the thermal imaging layer may be laminated to the photo-sensitive polymer side of the flexographic printing plate substrate using standard lamination processes.

In step 2040, a bottom side, or base layer side, of the flexographic printing plate substrate may be exposed to UV-A radiation, or another wavelength suitable for use with a given type of photo-sensitive polymer material, for a first time. The bottom side UV-A radiation may polymerize a portion of the photo-sensitive polymer layer from the bottom of the photo-sensitive polymer layer, nearest the base layer, towards the top of the photo-sensitive polymer layer. The depth to which the photo-sensitive polymer layer is polymerized may depend on the exposure time and the ability of the UV-A radiation to penetrate the photo-sensitive polymer layer. In one or more embodiments of the present invention, this first bottom side UV-A radiation exposure time may be controlled so that a total bottom side UV-A radiation exposure time sets a desired relief depth. The total exposure time estimated to achieve the desired relief depth may be partitioned between this first bottom side UV-A radiation exposure time and a second bottom side UV-A radiation exposure time.

In certain embodiments, the first bottom side UV-A radiation exposure time as a percentage of the total bottom side UV-A radiation exposure time may be approximately 50 percent. In other embodiments, the first bottom side UV-A radiation exposure time as a percentage of the total bottom side UV-A radiation exposure time may be in range between approximately 10 percent and approximately 90 percent. One of ordinary skill in the art will recognize that the first bottom side UV-A radiation exposure time as a percentage of the total bottom side UV-A radiation exposure time may vary in accordance with one or more embodiments of the present invention. In certain embodiments, the bottom side of the flexographic printing plate substrate may be first exposed to UV-A radiation for a period of time in a range between approximately 10 seconds and approximately 20 seconds. In other embodiments, the bottom side of the flexographic printing plate substrate may be first exposed to UV-A radiation for a period of time in a range between approximately 20 seconds and approximately 40 seconds. One of ordinary skill in the art will recognize that the first bottom side UV-A radiation exposure time may vary in accordance with one or more embodiments of the present invention.

In step 2050, a top side, or photo-sensitive polymer side, of the flexographic printing plate substrate may be exposed to UV-A radiation, or another wavelength suitable for use with a given type of photo-sensitive polymer material, through the thermal imaging layer to form the desired patterned design in the photo-sensitive polymer layer. In certain embodiments, the top side of the flexographic printing plate substrate may be exposed to UV-A radiation for a period of time in a range between approximately 200 seconds and approximately 1000 seconds. In other embodiments, the top side of the flexographic printing plate substrate may be exposed to UV-A radiation for a period of time in a range between approximately 1000 seconds and approximately 2000 seconds. One of ordinary skill in the art will recognize that the top side UV-A radiation exposure time may vary in accordance with one or more embodiments of the present invention.

In step 2060, the bottom side of the flexographic printing plate substrate may be exposed to UV-A radiation, or another wavelength suitable for use with a given type of photo-sensitive polymer material, for a second time. The bottom side UV-A radiation may partially polymerize a portion of the photo-sensitive polymer layer. The depth to which the photo-sensitive polymer layer is polymerized may depend on the exposure time and the ability of the UV-A radiation to penetrate the photo-sensitive polymer layer. In one or more embodiments of the present invention, the second bottom side UV-A radiation exposure time may be controlled so that the total bottom side UV-A radiation exposure time sets the desired relief depth. The total exposure time estimated to achieve the maximum desired depth may be partitioned between the first bottom side UV-A radiation exposure time of step 2040 and this second bottom side UV-A radiation exposure time of step 2060.

In certain embodiments, the second bottom side UV-A radiation exposure time as a percentage of the total bottom side UV-A radiation exposure time may be approximately 50 percent. In other embodiments, the second bottom side UV-A radiation exposure time as a percentage of the total bottom side UV-A radiation exposure time may be in range between approximately 90 percent and approximately 10 percent. One of ordinary skill in the art will recognize that the second bottom side UV-A radiation exposure time as a percentage of the total bottom side UV-A radiation exposure time may vary in accordance with one or more embodiments of the present invention. In certain embodiments, the bottom side of the flexographic printing plate substrate may be exposed to UV-A radiation for a period of time in a range between approximately 10 seconds and approximately 20 seconds. In other embodiments, the bottom side of the flexographic printing plate substrate may be exposed to UV-A radiation for a period of time in a range between approximately 20 second and approximately 40 seconds. One of ordinary skill in the art will recognize that the second bottom side UV-A radiation exposure time may vary in accordance with one or more embodiments of the present invention.

In step 2070, the thermal imaging layer may be removed from the flexographic printing plate substrate using standard delamination processes. In step 2080, the flexographic printing plate may be developed. The flexographic printing plate substrate may be developed with a washout liquid, such as a solvent or etchant, which removes the unexposed portions of the photo-sensitive polymer layer and leaves the UV-exposed portions of the photo-sensitive polymer layer in a pattern corresponding to the patterned design.

The relief depth may be measured from a top of the photo-sensitive polymer layer and corresponds to the depth of the valleys formed in the photo-sensitive polymer layer between the remaining UV-exposed portions of the photo-sensitive polymer layer. The remaining UV-exposed portions of the photo-sensitive polymer layer form the lines or features of the patterned design and may have a width of 10 micrometers or less. In certain embodiments, the relief depth may be in a range between approximately 150 micrometers and approximately 300 micrometers. In other embodiments, the relief depth may be in a range between approximately 20 micrometers and approximately 150 micrometers. In still other embodiments, the relief depth may be in a range between approximately 300 micrometers and approximately 400 micrometers. One of ordinary skill in the art will recognize that the relief depth may vary based on a specific design or application.

The quality of an image printed on substrate may be determined by an aspect ratio of the line or feature or support structure width, w, to the relief depth, $r_d$, of the patterned flexographic printing plate. As the desired line or feature or support structure width, w, of the flexographic printing plate gets smaller, the relief depth, $r_d$, must be reduced to maintain the aspect ratio. Thus, when printing high-resolution lines, features, or support structures with a width less than 10 micrometer, the relief depth, $r_d$, must be substantially shallower than that conventionally used. By reducing the relief depth, $r_d$, the base of photo-sensitive polymer layer may be thicker and provides improved support and stability to the patterned design formed on the flexographic printing plate. The improved support and stability may reduce or eliminate waviness, smearing, and uneven ink distribution. The desired relief depth, $r_d$, may depend on the total bottom side exposure time.

In step 2090, the flexographic printing plate substrate may be thermally baked to restore some rigidity to it after the development process. The flexographic printing plate substrate may be thermally baked at a temperature in a range between approximately 50 degrees Celsius and approximately 60 degrees Celsius for a period of time in a range between approximately 1 hour and approximately 3 hours. In step 2092, the flexographic printing plate substrate may be cured. The top side of the flexographic printing plate substrate may be exposed to UV-A radiation for a period of time in a range between approximately 0.5 minutes and approximately 5 minutes (or longer if needed) to crosslink or strengthen the features, as needed. The top side of the flexographic printing plate may then be exposed to UV-C radiation to remove any remaining volatile organic compounds and other contaminates from the surface of the flexographic printing plate, as needed. In step 2094, the flexographic printing plate substrate may be stored. The flexographic printing plate substrate may be stored for 8 or more hours at ambient temperatures to stabilize the plate, which is typically swollen from the solvent or etchant step of the manufacturing process. One of ordinary skill in the art will recognize that the storage time may vary in accordance with one or more embodiments of the present invention. After manufacturing, the flexographic printing plate may be mounted to a printing plate cylinder for use in a flexographic printing system.

Advantages of one or more embodiments of the present invention may include one or more of the following:

In one or more embodiments of the present invention, a method of manufacturing a flexographic printing plate with support structures reduces or eliminates waviness in printed lines or features and corresponding conductive lines or features of a conductive mesh.

In one or more embodiments of the present invention, a method of manufacturing a flexographic printing plate with support structures reduces or eliminates waviness without affecting the functional performance of a conductive mesh formed by the printed lines or features.

In one or more embodiments of the present invention, a method of manufacturing a flexographic printing plate with support structures reduces or eliminates waviness without affecting the aesthetic performance of a conductive mesh formed by the printed lines or features.

In one or more embodiments of the present invention, a method of manufacturing a flexographic printing plate with support structures includes support structures that may be isolated from, or otherwise not connected to, the lines or features of the flexographic printing plate. The corresponding plurality of printed support structures on substrate may also be isolated from, or otherwise not connected to, the printed lines or features on substrate. In this way, the plurality of support structures may provide a support function, but do not contribute to, or otherwise play a role in, the connectivity of the lines or features or the conductive meshes that they may form.

In one or more embodiments of the present invention, a method of manufacturing a flexographic printing plate with support structures reduces or eliminates waviness caused by breaks in one or more lines or features.

In one or more embodiments of the present invention, a method of manufacturing a flexographic printing plate with support structures reduces or eliminates waviness caused by bending of one or more lines or features.

In one or more embodiments of the present invention, a method of manufacturing a flexographic printing plate with support structures reduces or eliminates waviness without increasing the visual appearance of printed lines or features to an end user under normal operating conditions.

In one or more embodiments of the present invention, a method of manufacturing a flexographic printing plate with support structures reduces or eliminates waviness providing for high optical transmission of panels formed from the mesh patterns.

In one or more embodiments of the present invention, a method of manufacturing a flexographic printing plate with support structures reduces or eliminates waviness without the visual appearance of support structures to an end user under normal operating conditions.

In one or more embodiments of the present invention, a method of manufacturing a flexographic printing plate with support structures may use support structures having different shapes based on an application or a design.

In one or more embodiments of the present invention, a method of manufacturing a flexographic printing plate with support structures may use support structures disposed on one or both sides of a line or feature.

In one or more embodiments of the present invention, a method of manufacturing a flexographic printing plate with support structures may use support structures that are aligned with one or more breaks in one or more lines or features. Placing support structures that are aligned with breaks may reduce or eliminate the appearance of a virtual blank line formed by the breaks.

In one or more embodiments of the present invention, a method of manufacturing a flexographic printing plate with support structures may use support structures disposed on both sides of a line or feature that are aligned relative to one another.

In one or more embodiments of the present invention, a method of manufacturing a flexographic printing plate with support structures may use support structures disposed on both sides of a line or feature that are offset relative to one another.

In one or more embodiments of the present invention, a method of manufacturing a flexographic printing plate with support structures may use support structures that are offset relative to its corresponding line or feature such that the support structures provide adequate support, but do not add to the visual appearance of the support structures themselves or the line or feature.

In one or more embodiments of the present invention, a method of manufacturing a flexographic printing plate with support structures may use support structures that have a support structure-to-support structure spacing such that the support structures provide adequate support, but do not add to the visual appearance of the support structures themselves or the line or feature.

In one or more embodiments of the present invention, a method of manufacturing a flexographic printing plate with support structures compensates for the non-linear penetration of UV radiation into the photo-sensitive polymer layer of the flexographic printing plate substrate.

In one or more embodiments of the present invention, a method of manufacturing a flexographic printing plate with support structures provides a shallow relief depth that provides a thicker base of polymerized photo-sensitive polymer material that provides increased support and stability.

In one or more embodiments of the present invention, a method of manufacturing a flexographic printing plate with support structures provides a shallow relief depth suitable for use with micrometer-fine lines or features.

In one or more embodiments of the present invention, a method of manufacturing a flexographic printing plate with support structures maintains a desirable aspect ratio for micrometer-fine line or feature width to relief depth.

In one or more embodiments of the present invention, a method of manufacturing a flexographic printing plate with support structures may scale to smaller lines or features with shallower relief depths while maintaining a desirable aspect ratio.

In one or more embodiments of the present invention, a method of manufacturing a flexographic printing plate with support structures reduces the variability in relief depth from line to line.

In one or more embodiments of the present invention, a method of manufacturing a flexographic printing plate with support structures reduces or eliminates waviness, smearing, or uneven ink distribution during flexographic printing operations.

In one or more embodiments of the present invention, a method of manufacturing a flexographic printing plate with support structures may produce a flexographic printing plate capable of printing high-resolution lines or features having a width of 1 micrometer of less.

In one or more embodiments of the present invention, a method of manufacturing a flexographic printing plate with support structures may produce a flexographic printing plate capable of printing high-resolution lines or features having a width of 5 micrometers of less.

In one or more embodiments of the present invention, a method of manufacturing a flexographic printing plate with support structures may produce a flexographic printing plate capable of printing high-resolution lines or features having a width of 10 micrometers of less.

In one or more embodiments of the present invention, a method of manufacturing a flexographic printing plate with support structures may produce a flexographic printing plate capable of printing high-resolution lines or features that are smaller than a conventional flexographic printing plate is capable of printing.

In one or more embodiments of the present invention, a method of manufacturing a flexographic printing plate with support structures may produce a flexographic printing plate capable of printing high-resolution micro meshes that are smaller than a conventional flexographic printing plate is capable of printing.

In one or more embodiments of the present invention, a method of manufacturing a flexographic printing plate with support structures may produce a flexographic printing plate with a shallower relief depth than a conventional flexographic printing plate.

In one or more embodiments of the present invention, a method of manufacturing a flexographic printing plate with support structures may produce a flexographic printing plate that is stronger and more stable than a conventional flexographic printing plate.

In one or more embodiments of the present invention, a method of manufacturing a flexographic printing plate with support structures produces a flexographic printing plate compatible with flexographic printing processes.

While the present invention has been described with respect to the above-noted embodiments, those skilled in the art, having the benefit of this disclosure, will recognize that other embodiments may be devised that are within the scope of the invention as disclosed herein. Accordingly, the scope of the invention should be limited only by the appended claims.

What is claimed is:

1. A method of manufacturing a flexographic printing plate comprising:
    designing a patterned design comprising a plurality of lines and a plurality of support structures; and
    laser-ablating the patterned design into a thermal imaging layer,
    wherein a support structure of the plurality of support structures is disposed at an offset from a line of the plurality of lines.

2. The method of claim 1, further comprising:
    laminating the thermal imaging layer to a flexographic printing plate substrate.

3. The method of claim 2, further comprising:
    exposing the flexographic printing plate substrate to UV radiation.

4. The method of claim 3, further comprising:
    removing the thermal imaging layer; and
    developing the flexographic printing plate substrate.

5. The method of claim 4, further comprising:
    thermally baking the flexographic printing plate substrate;
    curing the flexographic printing plate substrate; and
    storing the flexographic printing plate substrate.

6. The method of claim 1, wherein the plurality of support structures are isolated from the plurality of lines.

7. The method of claim 1, wherein the plurality of support structures are isolated from each other.

8. The method of claim 1, wherein the offset is in a range between 25 percent and 50 percent of a line-to-line spacing between at least two lines of the plurality of lines.

9. The method of claim 1, wherein a support structure-to-support structure spacing between at least two support structures of the plurality of support structures corresponds to a spacing between two breaks in a line of the plurality of lines.

10. The method of claim 1, wherein one or more support structures of the plurality of support structures are aligned with one or more breaks in a line of the plurality of lines.

11. The method of claim 10, wherein one or more support structures of the plurality of support structures have a length equal to a length of the one or more breaks.

12. The method of claim 1, wherein one or more support structures of the plurality of support structures have a width equal to a width of one or more lines of the plurality of lines.

13. The method of claim 1, wherein one or more lines of the plurality of lines have a width less than 5 micrometers.

14. The method of claim 1, wherein one or more lines of the plurality of lines have a width in a range between 5 micrometers and 10 micrometers.

15. The method of claim 3, wherein exposing comprises:
    exposing a bottom side of the flexographic printing plate substrate to UV-A radiation; and
    exposing a top side of the flexographic printing plate substrate to UV-A radiation through the thermal imaging layer.

16. The method of claim 3, wherein exposing comprises:
    exposing a bottom side of the flexographic printing plate substrate to UV-A radiation for a first exposure time;
    exposing a top side of the flexographic printing plate substrate to UV-A radiation through the thermal imaging layer; and
    exposing the bottom side of the flexographic printing plate substrate to UV-A radiation for a second exposure time,
    wherein a sum of the first and second exposure times set a relief depth.

17. The method of claim 16, wherein the first exposure time is 50 percent of the sum of the first and second exposure times.

18. The method of claim 16, wherein the second exposure time is 50 percent of the sum of the first and second exposure times.

19. The method of claim 16, wherein the first exposure time is in a range between 10 percent and 90 percent of the sum of the first and second exposure times.

20. The method of claim 16, wherein the second exposure time is in a range between 90 percent and 10 percent of the sum of the first and second exposure times.

* * * * *